(12) United States Patent
Nam

(10) Patent No.: US 9,805,929 B2
(45) Date of Patent: Oct. 31, 2017

(54) METHOD OF FORMING FINE PATTERNS IN A SEMICONDUCTOR DEVICE AND METHOD OF MANUFACTURING AN ELECTRONIC DEVICE

(71) Applicant: Samsung Electronics Co., Ltd., Suwon-si (KR)

(72) Inventor: Yun Suk Nam, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/814,470

(22) Filed: Jul. 30, 2015

(65) Prior Publication Data
US 2016/0293419 A1  Oct. 6, 2016

(30) Foreign Application Priority Data
Apr. 6, 2015  (KR) ........................ 10-2015-0048427

(51) Int. Cl.
| H01L 21/44 | (2006.01) |
| H01L 21/033 | (2006.01) |
| H01L 21/311 | (2006.01) |
| H01L 23/528 | (2006.01) |
| H01L 21/768 | (2006.01) |

(52) U.S. Cl.
CPC .... *H01L 21/0337* (2013.01); *H01L 21/31144* (2013.01); *H01L 21/76816* (2013.01); *H01L 23/528* (2013.01)

(58) Field of Classification Search
CPC   G07F 9/02; B82Y 10/00; B82Y 40/00; G03F 1/36; G03F 7/0002; G06Q 30/0224; G06Q 30/0269; G06Q 30/0601; G06Q 40/12
See application file for complete search history.

(56) References Cited

U.S. PATENT DOCUMENTS

| 7,611,980 B2 | 11/2009 | Wells et al. |
| 7,759,197 B2 | 7/2010 | Tran |
| 7,816,060 B2 | 10/2010 | Nakamura |
| 7,829,262 B2 | 11/2010 | Tran |
| 8,034,544 B2 | 10/2011 | Yune |
| 8,216,774 B2 | 7/2012 | Hatakeyama |
| 8,278,223 B2 | 10/2012 | Kang |
| 8,609,324 B2 | 12/2013 | Tran |
| 8,652,968 B2 | 2/2014 | Yu et al. |
| 2006/0046484 A1 | 3/2006 | Abatchet et al. |
| 2007/0049035 A1 | 3/2007 | Tran |
| 2008/0017996 A1 | 1/2008 | Sato et al. |
| 2010/0112496 A1 | 5/2010 | Nakajima |
| 2012/0009523 A1 | 1/2012 | Lee et al. |
| 2014/0127909 A1 | 5/2014 | Sipani et al. |

(Continued)

FOREIGN PATENT DOCUMENTS

| JP | 4945802 | 6/2012 |
| JP | 5132098 | 1/2013 |
| JP | 5206974 | 6/2013 |

(Continued)

*Primary Examiner* — Robert Bachner
(74) *Attorney, Agent, or Firm* — Muir Patent Law, PLLC

(57) ABSTRACT

Methods of forming fine patterns having a width and a pitch in semiconductor devices may be used to form a semiconductor device or electronic device. The fine patterns may be formed by forming sacrificial pillars, which in certain examples may be formed from spacer patterns.

20 Claims, 28 Drawing Sheets

(56) References Cited

U.S. PATENT DOCUMENTS

2014/0131830 A1    5/2014   Shepard
2014/0162461 A1    6/2014   Kim et al.

FOREIGN PATENT DOCUMENTS

| KR | 10-2005-0069360 | 7/2005 |
| KR | 10-1011490 | 1/2011 |
| KR | 10-2012-0120666 | 11/2012 |
| KR | 10-2012-0122707 | 11/2012 |

METHOD OF FORMING FINE PATTERNS IN A SEMICONDUCTOR DEVICE AND METHOD OF MANUFACTURING AN ELECTRONIC DEVICE

CROSS-REFERENCE TO RELATED APPLICATIONS

This U.S. non-provisional patent application claims priority under 35 U.S.C. §119 to Korean Patent Application No. 10-2015-0048427 filed on Apr. 6, 2015 in the Korean Intellectual Property Office (KIPO), the contents of which are herein incorporated by reference in their entirety.

TECHNICAL FIELD

Example embodiments of the present inventive concepts relate to methods of forming fine patterns in a semiconductor device.

DISCUSSION OF RELATED ART

Nowadays, semiconductor devices are often highly integrated and highly densified. Therefore, design rules of the semiconductor devices have been continuously reduced and methods of forming fine patterns in the semiconductor devices are used. Sometimes because they are so small, the fine patterns need to be formed by using a technology that is beyond the resolution limit of photolithography equipment.

SUMMARY

Embodiments of the inventive concepts may provide methods of forming fine patterns having a width and a pitch in semiconductor devices, and methods of forming electronic devices including fine patterns in semiconductor devices. The fine patterns may be formed by forming sacrificial pillars, which in certain examples may be formed from spacer patterns.

BRIEF DESCRIPTION OF THE DRAWINGS

The foregoing and other features and advantages of this disclosure will be apparent from the more particular description of the example embodiments, as illustrated in the accompanying drawings in which like reference characters refer to the same or similar parts throughout the different views. The drawings are not necessarily to scale, emphasis instead being placed upon illustrating the principles of the disclosed embodiments.

DETAILED DESCRIPTION

Figure 1:
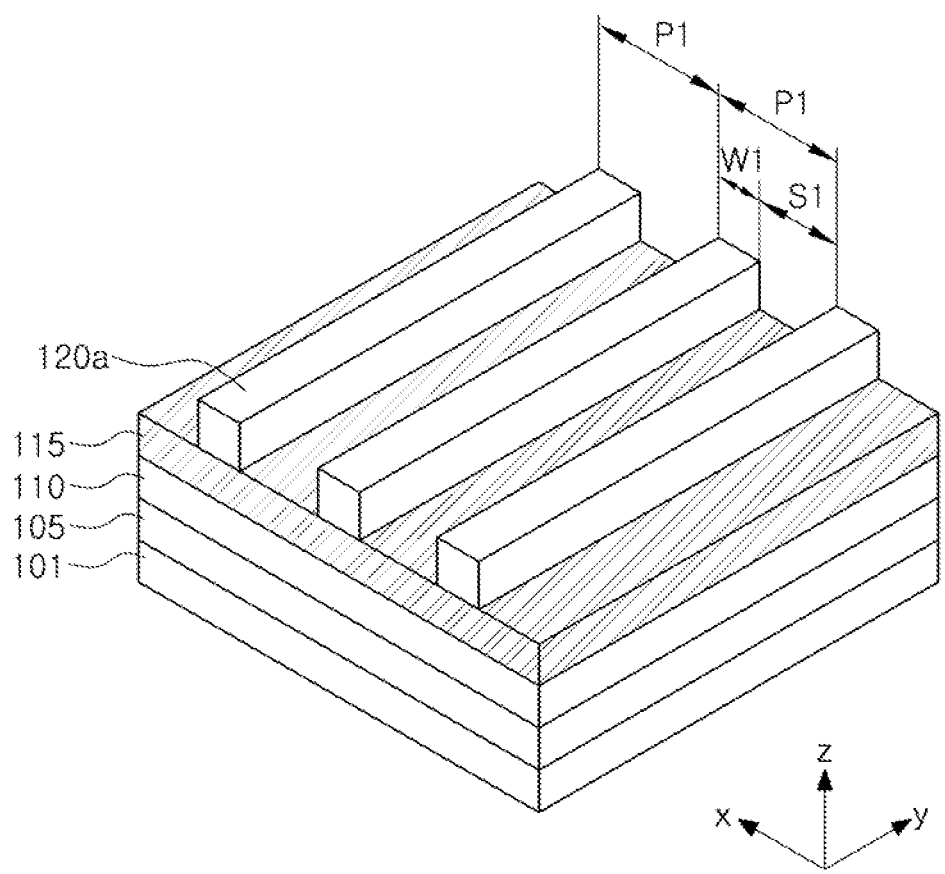
FIGS. 1 through 18 are perspective views and plan views illustrating a method of forming fine patterns in a semiconductor device according to certain example embodiments.

Example embodiments of the inventive concepts will now be described more fully hereinafter with reference to the accompanying drawings; however, they may be embodied in different forms and should not be construed as limited to the exemplary embodiments set forth herein.

It will be understood that when an element is referred to as being "on," "connected" or "coupled" to another element, it can be directly on, connected or coupled to the other element or intervening elements may be present. In contrast, when an element is referred to as "contacting," or being "directly on," "directly connected" or "directly coupled" to another element, there are no intervening elements present. Other words used to describe the relationship between elements or layers should be interpreted in a like fashion (e.g., "between" versus "directly between," "adjacent" versus "directly adjacent," "under" versus "directly under").

It will be understood that, although the terms "first", "second", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below in one section of the specification could be termed a second element, component, region, layer or section in another section of the specification, or in the claims, without departing from the teachings of example embodiments. In addition, in certain cases, even if a term is not described using "first," "second," etc., in the specification, it may still be referred to as "first" or "second" in a claim in order to distinguish different claimed elements from each other.

In the figures, the dimensions of layers and regions may be exaggerated for clarity of illustration.

Spatially relative terms, e.g., "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the term "and/or" includes any and all combinations of one or more of the associated listed items. The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art. It is noted that the use of any and all examples, or exemplary terms provided herein is intended merely to better illuminate the example embodiments and is not a limitation on the scope of the inventive concepts unless otherwise specified.

Example embodiments will be described with reference to perspective views, cross-sectional views, and/or plan views. The profile of an example view may be modified according to, e.g., manufacturing techniques and/or allowances. Accordingly, the example embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, example embodiments of the inventive concepts will be described in detail with reference to the accompanying drawings.

FIGS. 1 through 18 are perspective views and plan views illustrating a method of forming fine patterns in a semiconductor device according to certain example embodiments of the inventive concepts.

Referring to FIG. 1, an insulating layer 105 may be formed on a lower layer 101. The lower structure 101 may be a semiconductor substrate. The semiconductor substrate may comprise, for example, at least one of a single crystalline silicon substrate, a silicon-on-insulator substrate, and/or a silicon epitaxial layer. A transistor may be formed on the semiconductor substrate. In some embodiments, the lower structure 101 may comprise one or more of doped poly crystalline silicon, metal silicide, metal material, metal nitride, and conductive material including a mixture of one or more of these materials.

An etch stop layer may be formed on the lower structure 101 before forming the insulating layer 105. The etch stop layer may comprise, for example, one or more of silicon oxide ($SiO_x$), silicon nitride ($Si_xN_y$), silicon oxynitride (SiON), silicon carbide (SiC), silicon carbon nitride (SiCN), and a mixture thereof. In certain embodiments, the insulating layer 105 may comprise silicon oxide ($SiO_x$) or low-k dielectric material. The low-k dielectric material may comprise, for example, TEOS (TetraEthylOrthoSilicate), USG (Undoped Silicate Glass), PSG (PhosphoSilicate Galss), BSG (BoroSilicate Glass), BPSG (BoroPhosphoSilicate Glass), FSG (Fluoride Silicate Glass), SOG (Spin On Glass), TOSZ (Tonen SilaZene), or a mixture of one or more of these materials.

A first hard mask layer 110 and a first sacrificial layer 115 may be formed on the insulating layer 105.

The hard mask layer 110 may comprise, for example, one or more of silicon oxide ($SiO_x$), silicon nitride ($Si_xN_y$), silicon oxynitride (SiON), silicon carbon nitride (SiCN), and poly crystalline silicon. For example, the first hard mask layer 110 may comprise poly crystalline silicon.

Figure 3:
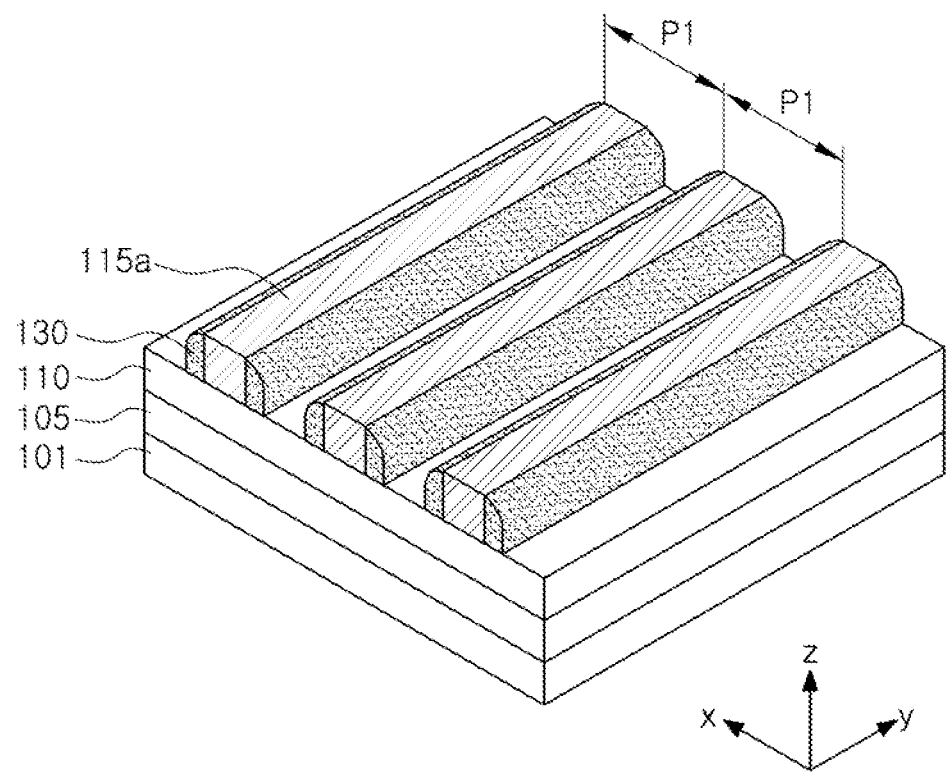

The first sacrificial layer 115 may be used to form a plurality of first spacers 130a at a following step (see FIG. 3). The first sacrificial layer 115 may have an etch selectivity with respect to, and thus may have an etching rate faster than, the first hard mask layer 110. The first sacrificial layer 115 may comprise, for example, ACL (amorphous carbon layer) or SOH (Spin-On Hardmask). For example, the first sacrificial layer 115 may be a SOH layer.

An anti-reflective layer (not shown) may be formed on the first sacrificial layer 115. The anti-reflective layer may comprise an organic compound or an inorganic compound. For example, the anti-reflective layer may comprise a silicon oxynitride (SiON) layer.

The first hard mask layer 110 and the first sacrificial layer 115 may be formed by using, for example, an ALD (Atomic Layer Deposition) process, a CVD (Chemical Vapor Deposition) process, or a spin coating process. A bake process or a curing process may be further performed.

A plurality of first photoresist patterns 120a extending in parallel in a first direction (e.g., Y-direction) may be formed on the first sacrificial layer 115. The first photoresist patterns 120a may be formed, for example, by performing coating a photoresist on the first sacrificial layer 115, exposing the photoresist, and developing the photoresist. The first photoresist patterns 120a may have a minimum width and a minimum pitch that are available to be formed by photolithography equipment. In certain embodiments, a width W1 of each of the first photoresist patterns 120a may be smaller than a space S1 between each of the first photoresist patterns 120a. The first photoresist patterns 120a may have a pitch P1. The pitch P1 may be sum of the width W1 and the space S1. The first photoresist patterns 120a may be parallel to each other. The width W1 of the first photoresist patterns 120a may be decided considering a final pitch of holes. For example, the width W1 of the first photoresist patterns 120a may have a range of about 25 nm to about 35 nm and the pitch P1 of the first photoresist patterns 120a may have a range of about 88 nm to about 108 nm.

Figure 2:
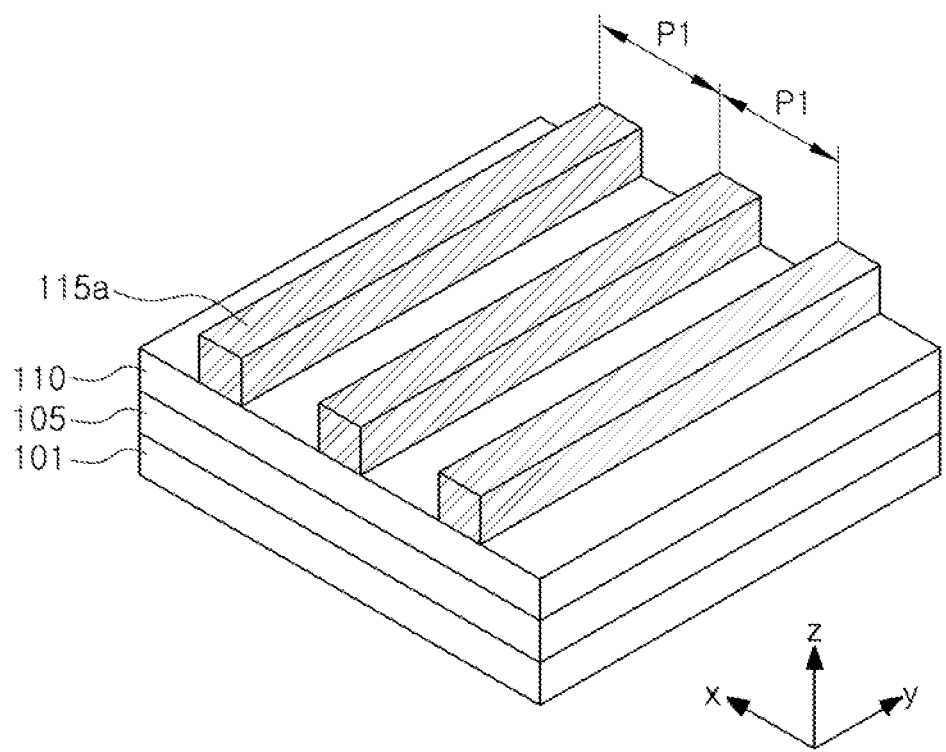

Referring to FIG. 2, a plurality of first sacrificial patterns 115a may be formed on the first hard mask layer 110 by patterning the first sacrificial layer 115 using, for example, an anisotropic etching process. The first sacrificial patterns 115a may extend in parallel in the first direction. A pitch of the first sacrificial patterns 115a may be substantially the same as the first photoresist patterns as shown in FIG. 1.

The first photoresist patterns 120a may be removed, for example, by using an ashing and strip process after forming the first sacrificial patterns 115a.

Referring to FIG. 3, a plurality of first spacers 130 may be formed on sidewalls of the first sacrificial patterns 115a, for example on opposite sidewalls of each of the first sacrificial patterns 115a.

Specifically, a method of forming the plurality of first spacers 130 may comprise forming a first spacer material layer conformally on the first sacrificial patterns 115a and performing an etch-back process on the first spacer material layer.

A thickness of the first spacer material layer may be decided considering final size of the plurality of holes 105h (see FIG. 18) which are formed in the insulating layer 105 at a following step.

The first spacer material layer may have an etch selectivity with respect to, and thus may have an etching rate faster than, the first sacrificial patterns 115a and the first hard mask layer 110, respectively. For example, when the first hard mask layer 110 is formed of poly crystalline silicon and the first sacrificial patterns 115 is formed of SOH, the first spacer material layer may be formed of silicon oxide, silicon oxynitride, or silicon nitride.

The thickness of the first spacer material layer may affect not only a line width of the first spacer pattern 130a (see FIG. 4) that would be formed at a following step but also size of holes 105h (see FIG. 18) that would be formed in the insulating layer 105. The first spacer material layer may be formed, for example, by using an ALD (Atomic Layer Deposition) process that has an ability of controlling minutely the thickness. The ALD process may make the tolerance of the holes less than 1 nm.

Figure 4:
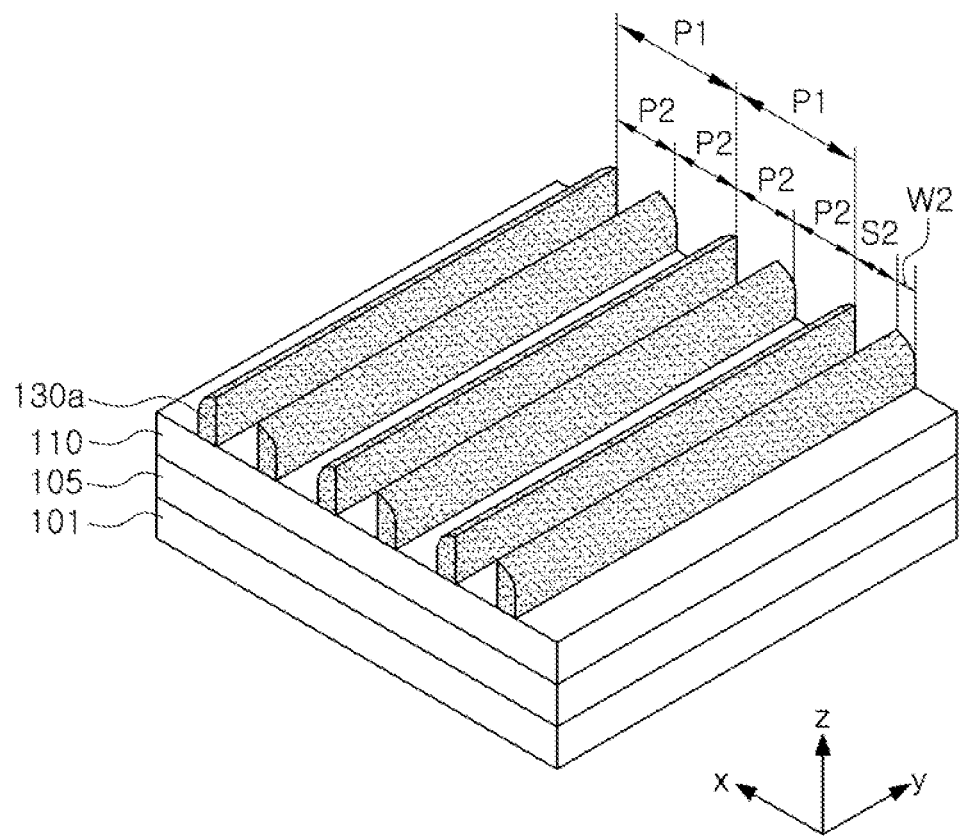

Referring to FIG. 4, a plurality of first spacer patterns 130a extending in parallel in the first direction (e.g., Y-direction) may be formed on the first hard mask layer 110 by removing the first sacrificial patterns 115a. As such, the first spacer patterns 130a may include the same material having the same structure as the first spacers 130, but without the first sacrificial pattern 115a therebetween. As such, they may be standalone, free-standing structures. Each width W2 of the first spacer patterns 130a may be less than each space S2 between two adjacent spacer patterns of the first spacer patterns 130a. The space S2 may be substantially the same as the width W1 of the first sacrificial patterns 115a. The first spacer patterns 130a may have a pitch P2 and be arranged parallel to etch other. The pitch P2 may be sum of the width W2 and the space S2. In certain example embodiments, the pitch P2 of the first spacer patterns 130a may be about half of the pitch P1 of the first photoresist patterns 120a. For example, the width W2 of the first spacer patterns 130a may have a range of about 16 nm to about 20 nm and the pitch P2 of the first spacer patterns 130a may have a range of about 44 nm to about 55 nm.

Figure 5:
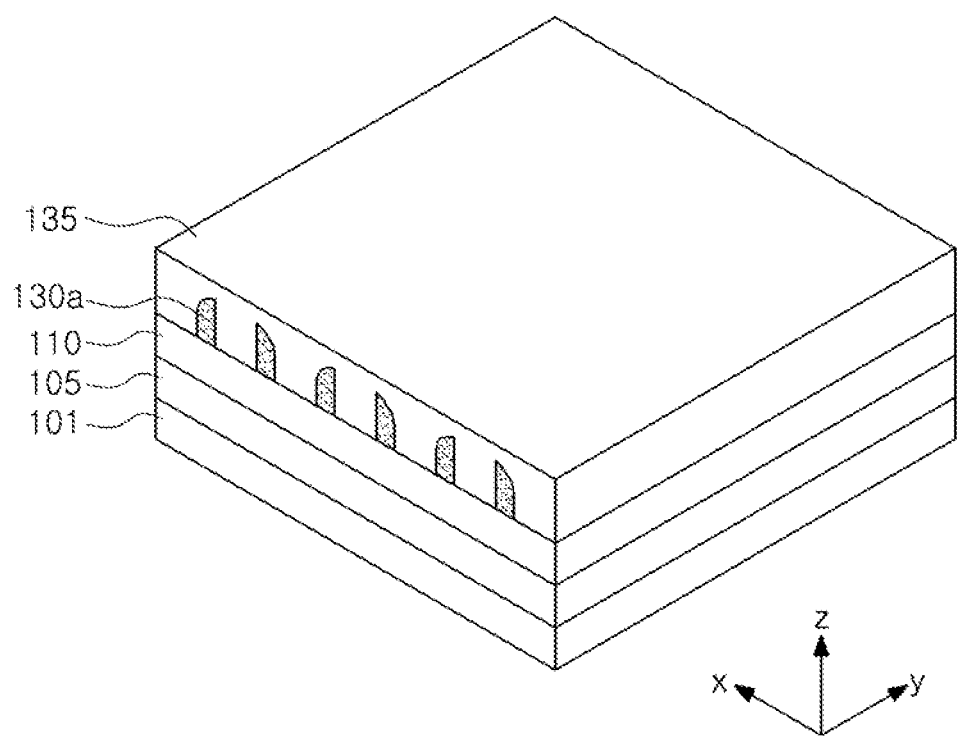

Referring to FIG. 5, a first planarized layer 135 may be formed on the first spacer patterns 130a. The first planarized layer 135 may be formed, for example, of an SOH layer. A method of forming the first planarized layer 135 may comprise forming the first planarized layer 135 using a spin coating process and performing a bake process on the first planarized layer 135. In certain embodiments, the first planarized layer 135 may be formed to contact the first spacer patterns 130a and to directly cover side and top surfaces of the first spacer patterns 130a.

Figure 6:
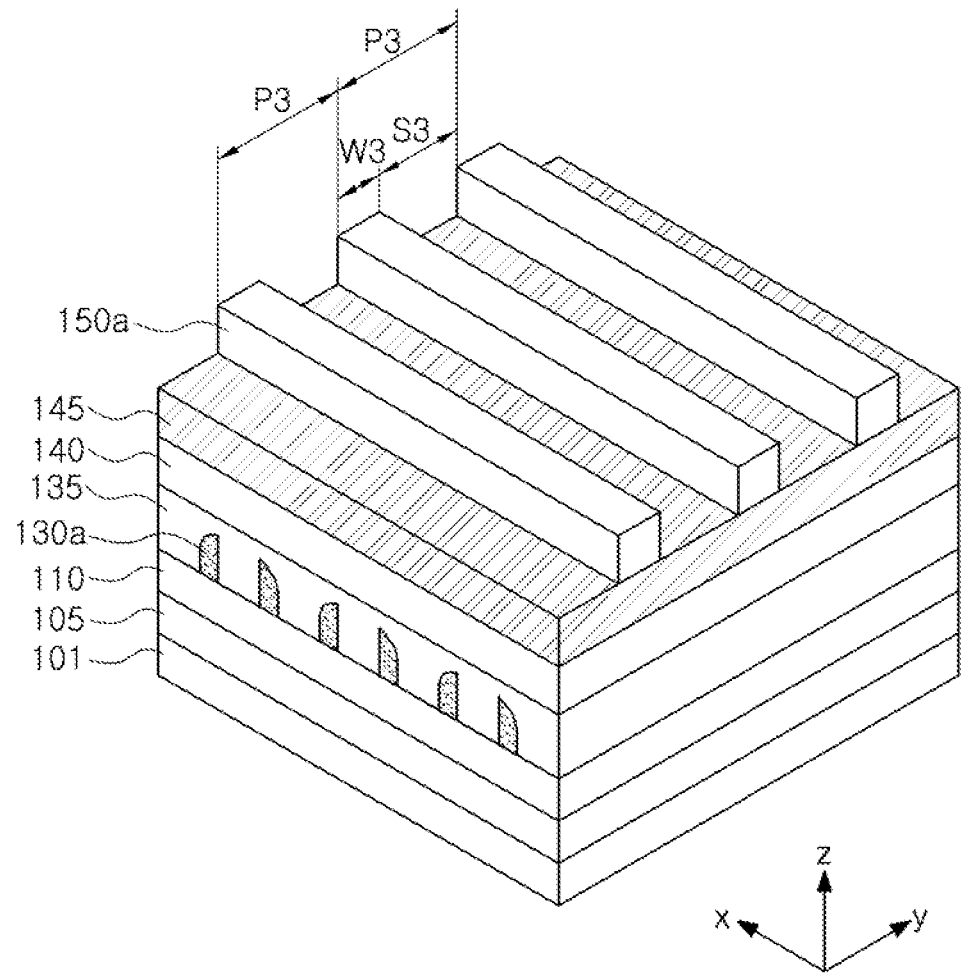

Referring to FIG. 6, a second hard mask layer 140 and a second sacrificial layer 145 may be formed on the first planarized layer 135.

The second hard mask layer 140 may comprise, for example, one or more of silicon oxide ($SiO_x$), silicon oxynitride (SiON), silicon nitride ($Si_xN_y$), silicon carbon nitride (SiCN), and poly crystalline silicon. For example, the second hard mask layer 140 may comprise poly crystalline silicon.

Figure 7:
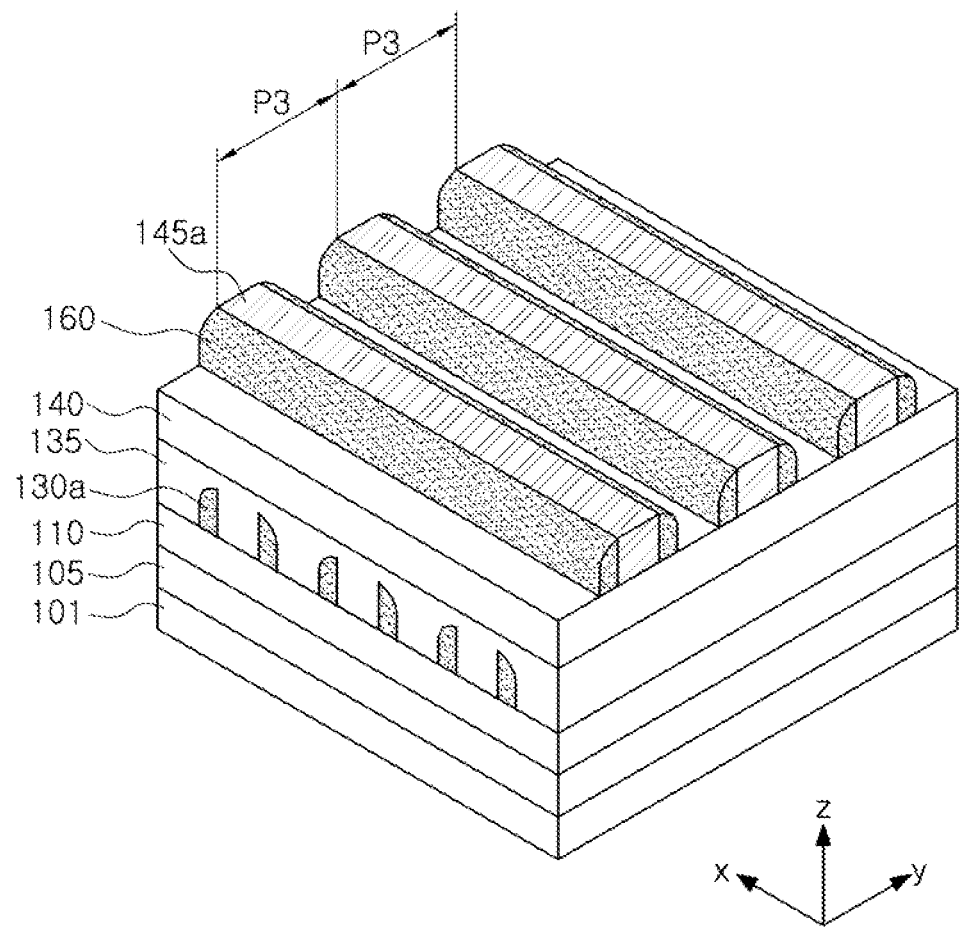

The second sacrificial layer 145 may be used to form a plurality of second spacers 160 at a following step (see FIG. 7). The second sacrificial layer 145 may have an etch selectivity with respect to, and thus may have an etching rate faster than, the second hard mask layer 140. The second sacrificial layer 145 may comprise, for example, ACL (amorphous carbon layer) or SOH (Spin-On Hardmask). For example, the second sacrificial layer 145 may be an SOH layer.

An anti-reflective layer (not shown) may be formed on the second sacrificial layer 145. The anti-reflective layer may comprise an organic compound or an inorganic compound. For example, the anti-reflective layer may comprise, for example, a silicon oxynitride (SiON) layer.

A plurality of second photoresist patterns 150a extending in parallel in a second direction (e.g., X-direction) may be formed on the second sacrificial layer 145. The second direction (e.g., X-direction) may cross the first direction (e.g., Y-direction). The second direction may be substantially perpendicular to the first direction. The second photoresist patterns 150a may be formed by performing coating of a photoresist on the second sacrificial layer 145, exposing the photoresist, and developing the photoresist. The second photoresist patterns 150a may have a minimum width and a minimum pitch that are available to be formed by photolithography equipment. A width W3 of the second photoresist patterns 150a may be smaller than a space S3 between each of the second photoresist patterns 150a. The second photoresist patterns 150a may have a pitch P3. The pitch P3 may be sum of the width W3 and the space S3. The second photoresist patterns 150a may be parallel to each other. The width W3 of the second photoresist patterns 150a may be decided considering a final pitch of holes. For example, the width W3 of the second photoresist patterns 150a may have a range of about 25 nm to about 35 nm and the pitch P3 of the second photoresist patterns 150a may have a range of about 88 nm to about 108 nm.

Referring to FIG. 7, a plurality of second spacers 160 may be formed on sidewalls of a plurality of second sacrificial patterns 145a, for example on opposite sidewalls of each of the second sacrificial patterns 145a.

The second sacrificial patterns 145a extending in the second direction (e.g., X-direction) may be formed, for example, by performing an anisotropic process on the second sacrificial layer 145 using the second photoresist patterns 150a as etch masks. The pitch P3 of the second sacrificial patterns 145a may be substantially the same as the pitch P3 of the second photoresist patterns 150a. The second photoresist pattern 150a may be removed by using an ashing and strip process after forming the second sacrificial patterns 145a.

A method of forming the second spacers 160 may comprise forming a second spacer material layer conformally on the second sacrificial patterns 145a and performing an etch-back process on the second spacer material layer.

A thickness of the second spacer material layer may be decided considering final size of the plurality of holes 105h (see FIG. 18) which are formed in the insulating layer 105 at a following step.

The second spacer material layer may have an etch selectivity with respect to, and thus may have an etching rate faster than, the second sacrificial patterns 145a and the second hard mask layer 140, respectively. For example, when the second hard mask layer 140 is formed of poly crystalline silicon and the second sacrificial patterns 145a is formed of SOH, the second spacer material layer may be formed of silicon oxide, silicon oxynitride, or silicon nitride.

Figure 8:
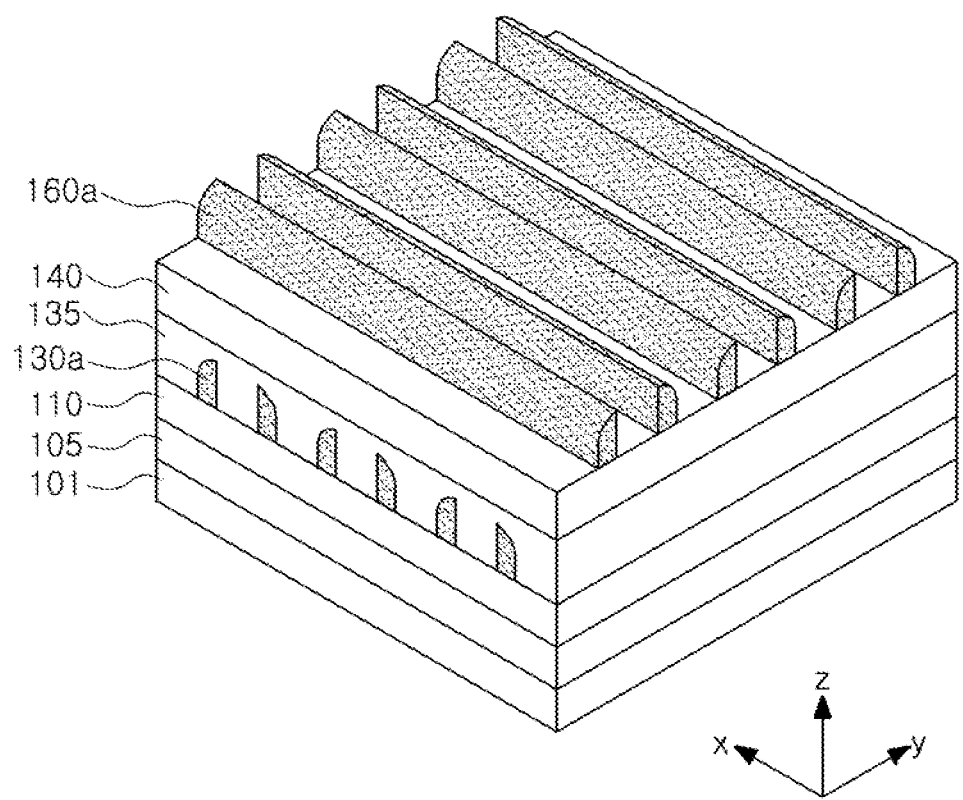
Figure 9:
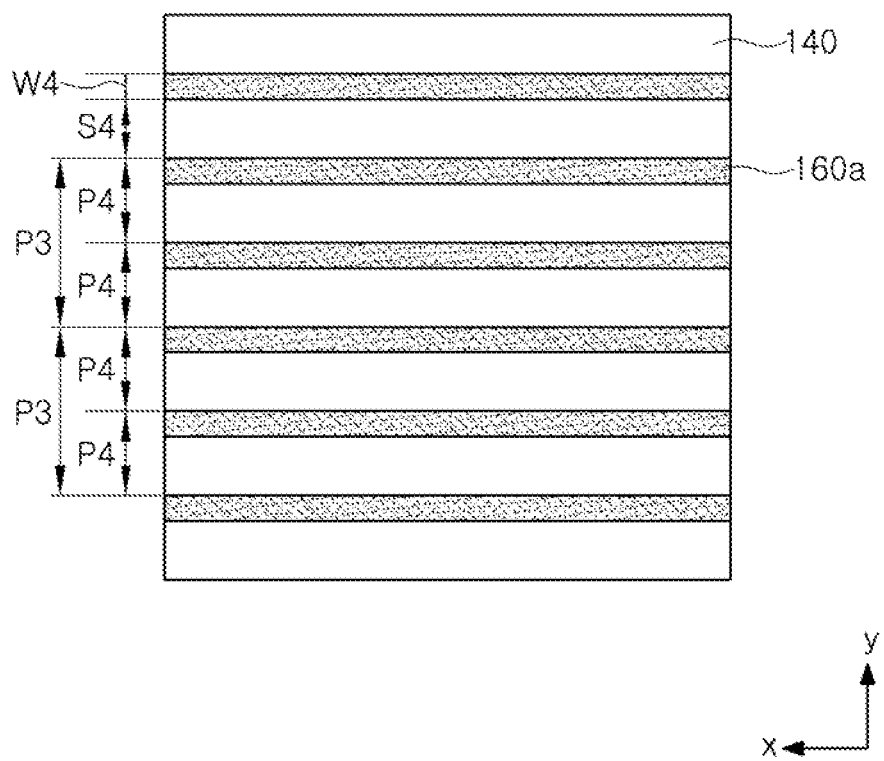

Referring to FIGS. 8 and 9, a plurality of second spacer patterns 160a extending in the second direction may be formed on the second hard mask layer 140 by removing the second sacrificial patterns 145a.

The thickness of the second spacer material layer may affect not only a line width of a second spacer pattern 160a (see FIG. 8) that would be formed at a following step but also size of holes 105h (see FIG. 18) that would be formed in the insulating layer 105. The second spacer material layer may be formed, for example, by using an ALD (Atomic Layer Deposition) process that has an ability of controlling minutely the thickness. The ALD process may make the tolerance of the holes less than 1 nm.

Each width W4 of the second spacer patterns 160a may be less than each space S4 between adjacent spacer patterns of the second spacer patterns 160a. The space S4 may be substantially the same as the width W3 of the second sacrificial patterns 145a. The second spacer patterns 160a may have a pitch P4 and be arranged parallel to etch other. The pitch P4 may be sum of the width W4 and the space S4. In certain example embodiments, the pitch P4 of the second spacer patterns 160a may be about half of the pitch P2 of the second photoresist patterns 150a. For example, the width W4 of the second spacer patterns 160a may have a range of about 16 nm to about 20 nm and the pitch P4 of the second spacer patterns 160a may have a range of about 44 nm to about 55 nm.

Figure 10:
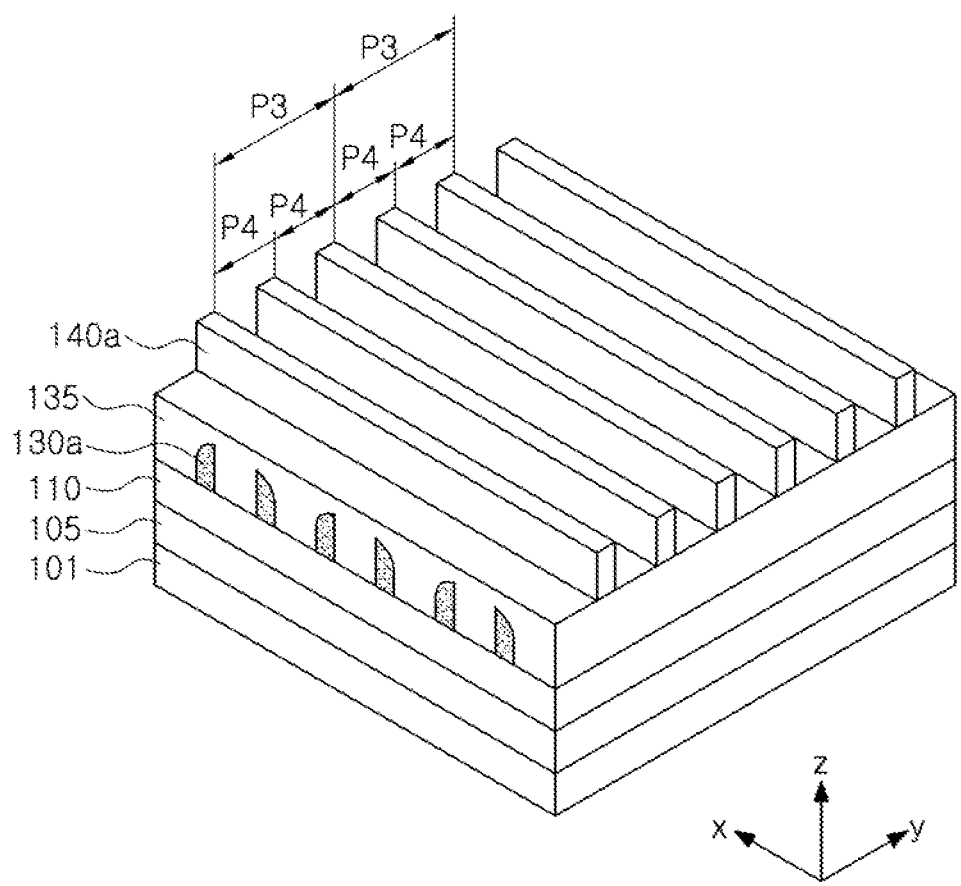

Referring to FIG. 10, a plurality of line mask patterns 140a extending in the second direction may be formed on the first planarized layer 135, for example by performing an anisotropic etch process on the second hard mask layer 140.

A pitch of the line mask patterns 140a may be substantially the same as the pitch P4 of the second spacer patterns 160a. A width of the line mask patterns 140a may be substantially the same as the width W4 of the second spacer patterns 160a. For example, the width of the line mask patterns 140a may have a range of about 16 nm to about 20 nm and the pitch of the line mask patterns 140a may have a range of about 44 nm to about 55 nm.

Figure 11:
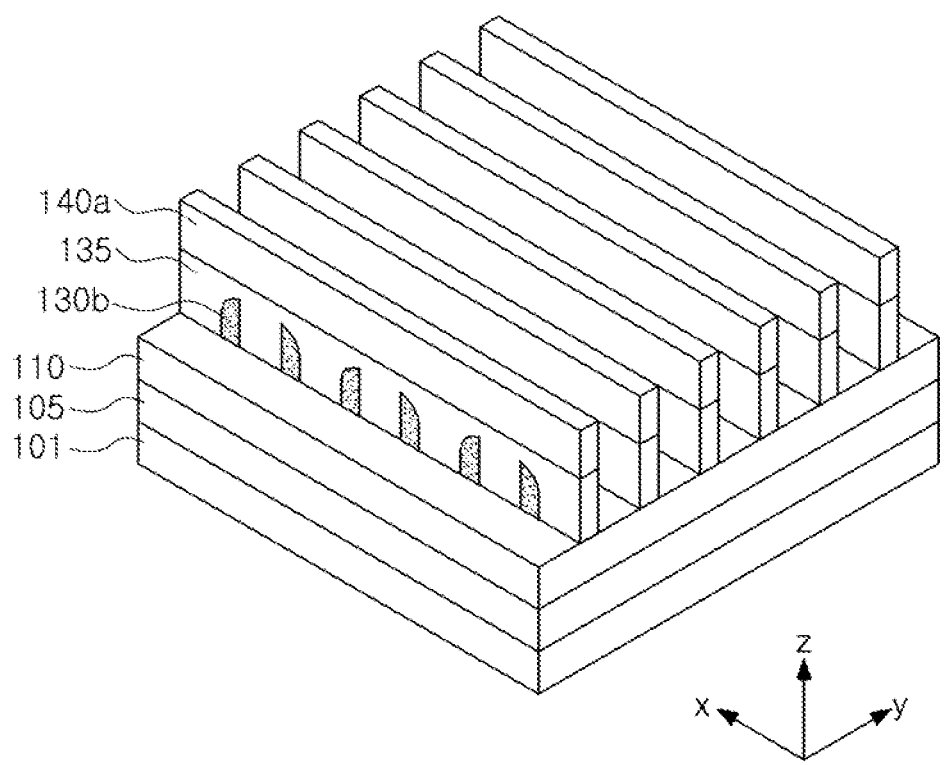

Referring to FIG. 11, some portions of the first planarized layer 135 and the first spacer patterns 130a may be etched by an anisotropic etch process using the line mask patterns as etch masks. The anisotropic etch process may be performed to expose an upper surface of the first hard mask layer 110 using a condition that may not have an etch selectivity with respect between the first planarized layer 135 and the first spacer patterns 130a. As a result, portions of the first planarized layer 135 and the first spacer patterns 130a not covered by the mask patterns 140a may be equally etched up to a surface of the first hard mask layer 110.

Figure 12:
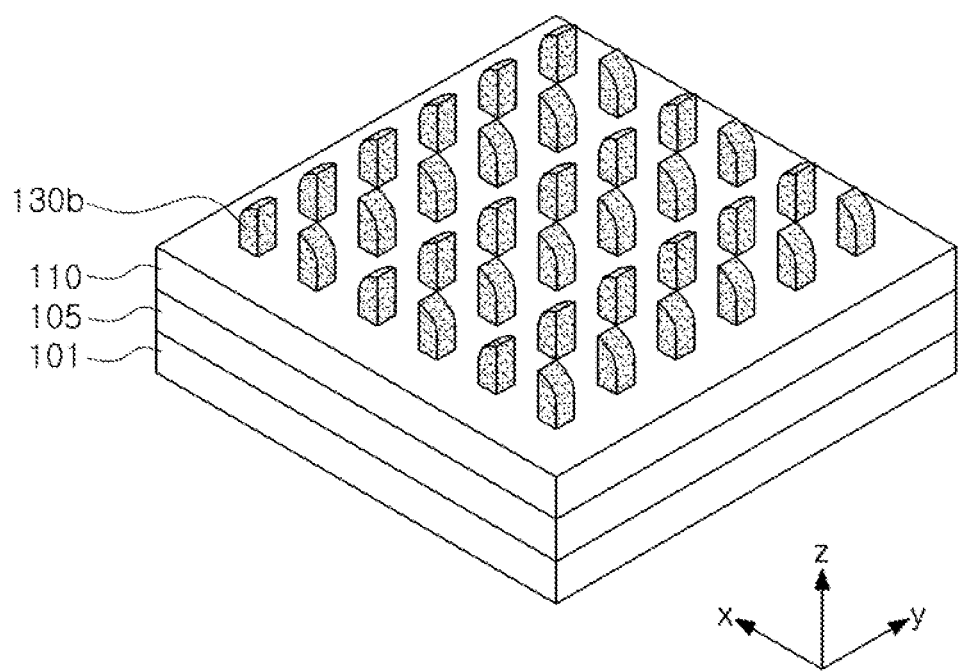
Figure 13:
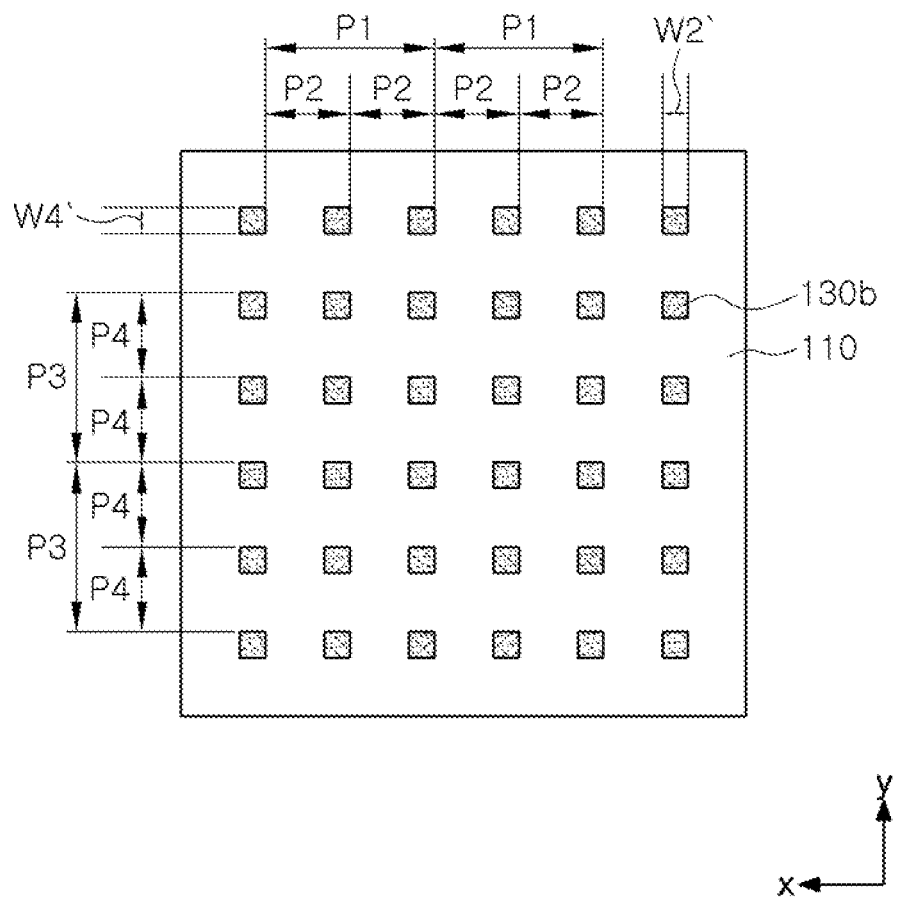

Referring to FIGS. 12 and 13, a plurality of sacrificial pillars 130b may be formed on the first hard mask layer 110. Each of the sacrificial pillars 130b may be spaced apart from each other in a first and a second direction. The first direction may be substantially perpendicular to the second direction. The sacrificial pillars 130b may have a pitch P4 in a first direction and a pitch P2 in a second direction. The pitch P4 may be substantially the same as the pitch of the line mask patterns 140a and the pitch P2 may be substantially the same as the pitch of the first spacer patterns 130a. The sacrificial pillars 130b may have a tetragonal shape in a top view. The sacrificial pillars 130b may have a first width in the first direction and a second width in the second direction. The first width of the sacrificial pillars 130b may be substantially the same as the width W4 of the line mask patterns 140a and the second width of the sacrificial pillars 130b may be substantially the same as the width W2 of the first spacer patterns 130a. Thus, in certain embodiments, the width of the sacrificial pillars 130b W4' in a first direction (e.g., Y-direction) is substantially the same as the width of the sacrificial pillars 130b W2' in a second direction (e.g., X-direction).

Figure 14:
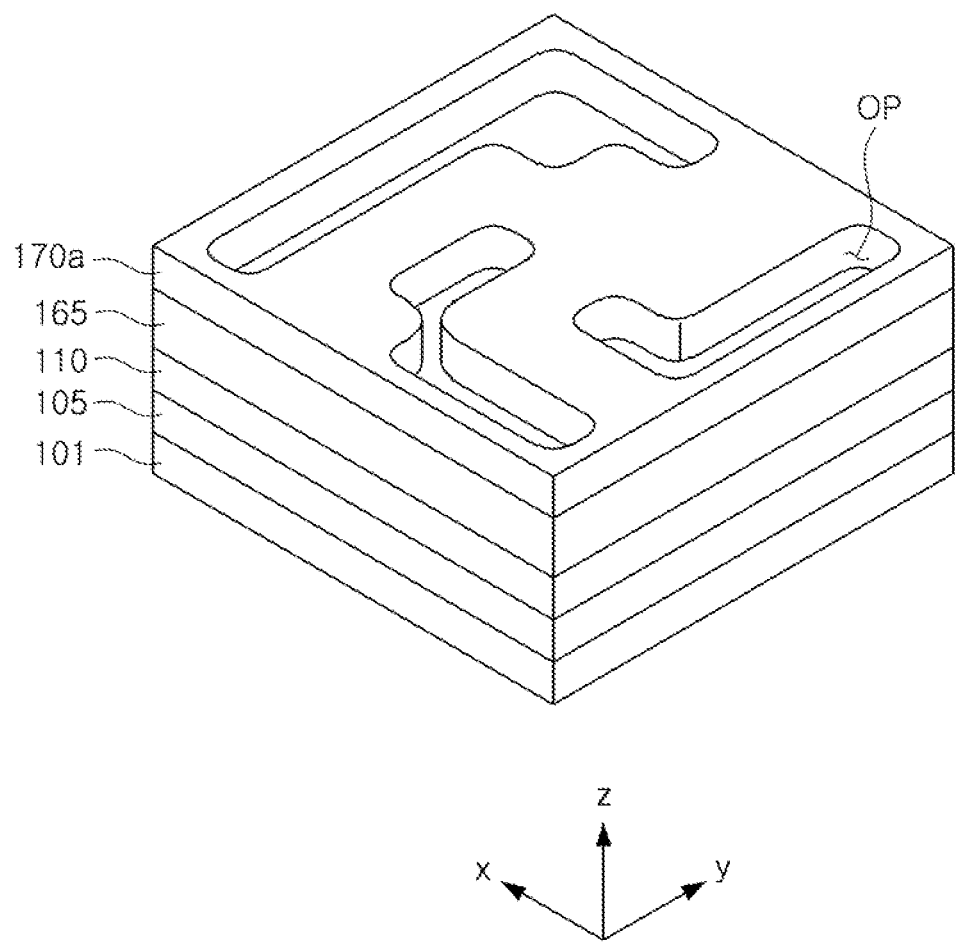
Figure 15:
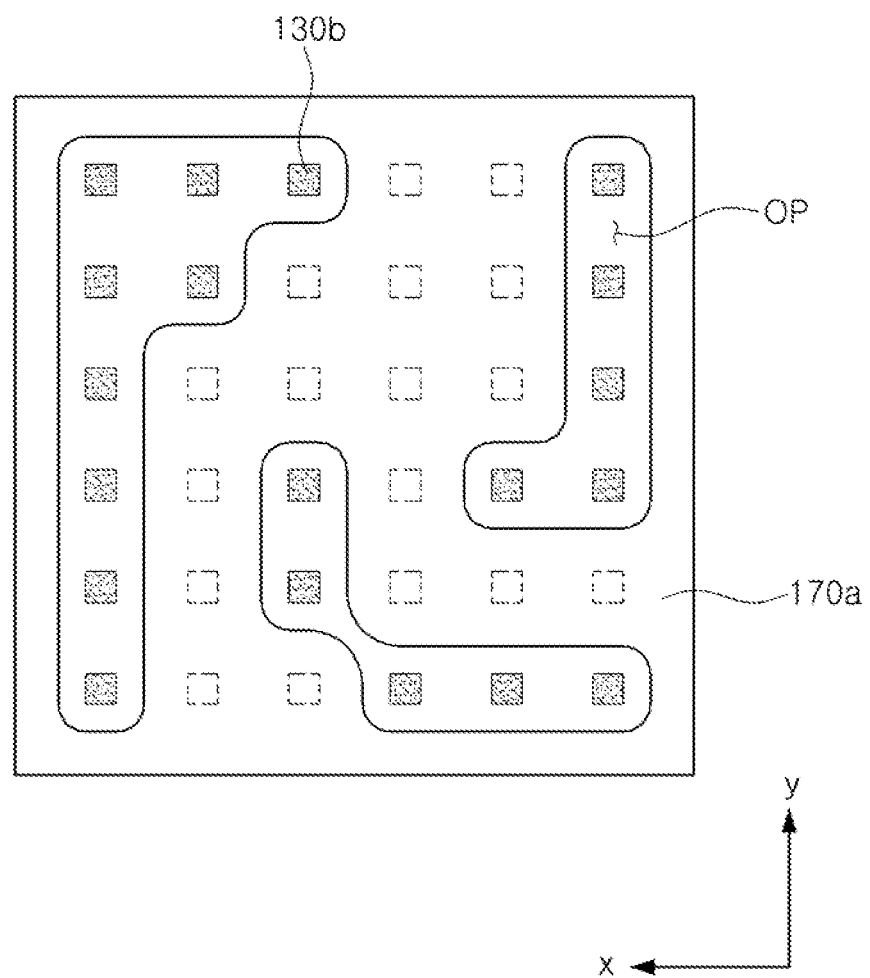

Referring to FIGS. 14 and 15, a second planarized layer 165 may be formed to fill gaps between the sacrificial pillars 130b. A third photoresist pattern 170a may be formed on the second planarized layer 165.

The second planarized layer 165 may be formed, for example, of a SOH layer. A method of the second planarized layer 165 may comprise forming the second planarized layer 165 using a spin coating process and performing a bake process on the first planarized layer 135. Upper surfaces of the sacrificial pillars 130b may be exposed or may not be exposed after forming the second planarized layer 165.

In some embodiments, the second planarized layer 165 may initially be formed to contact the sacrificial pillars 130b and to directly cover side and top surfaces of the sacrificial pillars 130b. Then, a planarization process, e.g., an etch-back process or a CMP (Chemical Mechanical Polishing) process, may be performed on the second planarized layer 165 to expose upper surfaces of the sacrificial pillars 130b.

An anti-reflective layer (not shown) may be formed on the second planarized layer 165. The third photoresist pattern 170a may have openings OP to remove some of the sacrificial pillars 130b from the second planarized layer 165.

Figure 16:
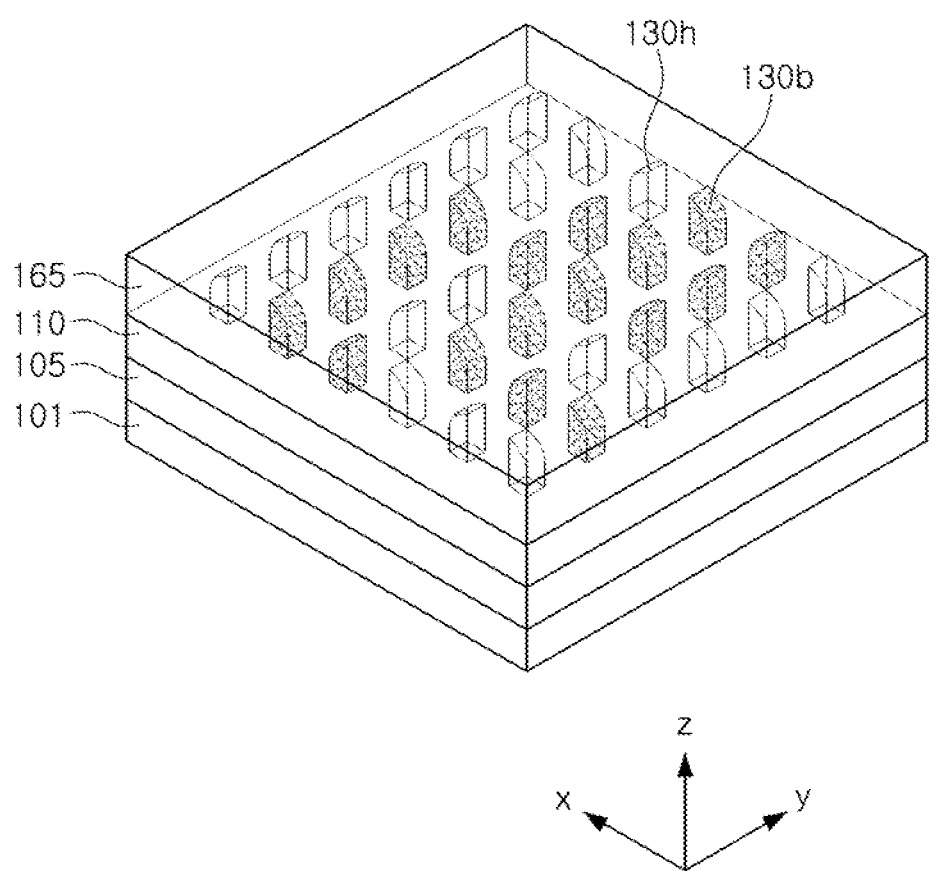

Referring to FIG. 16, some of the sacrificial pillars 130b may be removed by an etch process using the third photoresist pattern 170a as an etch mask. Therefore, a plurality of preliminary holes 130h may be formed in the second planarized layer 165.

An upper portion of the second planarized layer 165 exposed in the openings OP may be removed to expose upper portions of the sacrificial pillars 130b before removing some of the sacrificial pillars 130b in the openings OP. Some of the sacrificial pillars 130b may be removed by using a selective etch process with respect to the second planarized layer 165. Therefore, a plurality of preliminary holes 130h may be formed in the second planarized layer 165. The size of preliminary holes 130h may be substantially the same as the size of the sacrificial pillars 130b.

Figure 17:
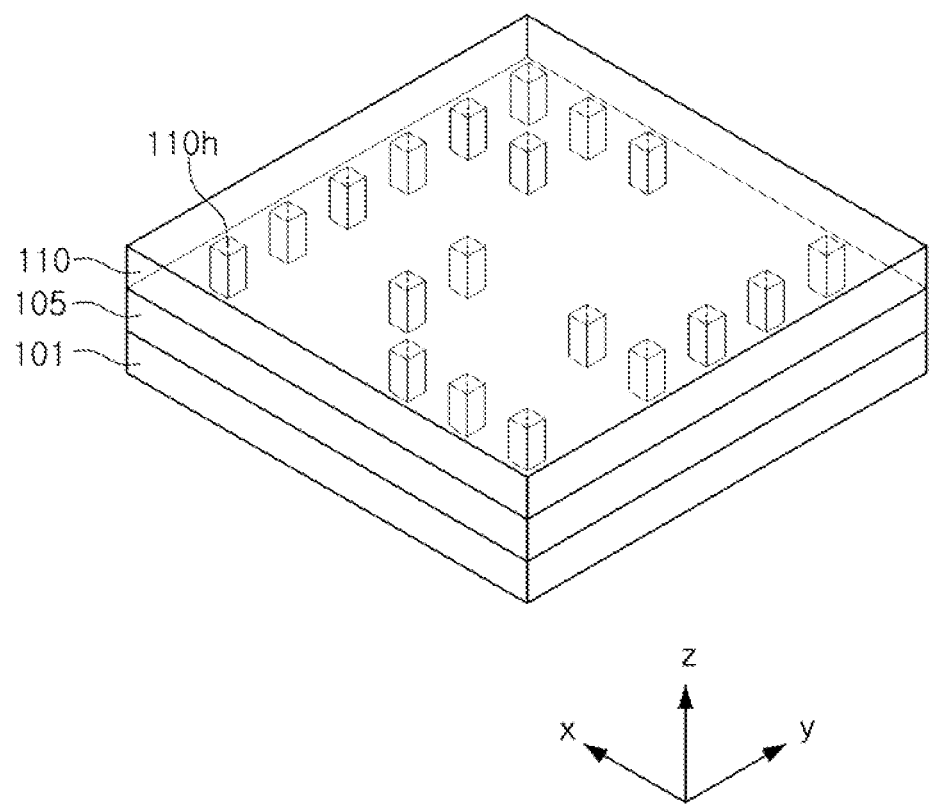

Referring to FIG. 17, a hard mask pattern may be formed by patterning the first hard mask layer 110 using the second planarized layer 165 having the preliminary holes 130 as an etch mask. The hard mask pattern may have openings 110h.

The second planarized layer 165 and the sacrificial pillars 130b may be removed to expose an upper surface of the first hard mask layer 110.

Figure 18:
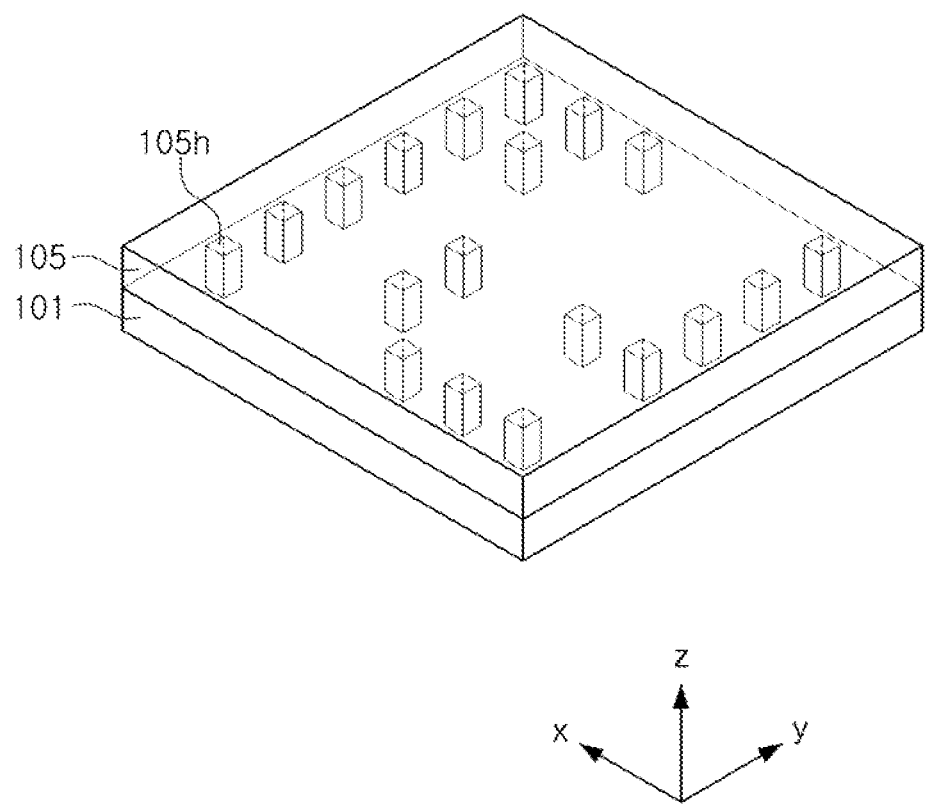

Referring to FIG. 18, a plurality of holes 105h may be formed in the insulating layer 105 by patterning the insulating layer 105 using the hard mask pattern as an etch mask. Although the holes 105h are disclosed as a tetragonal shape in FIG. 18, it shall not be restricted or limited thereto. For example, the holes 105h may have a round shape, or other pillar-type shape.

Figure 19:
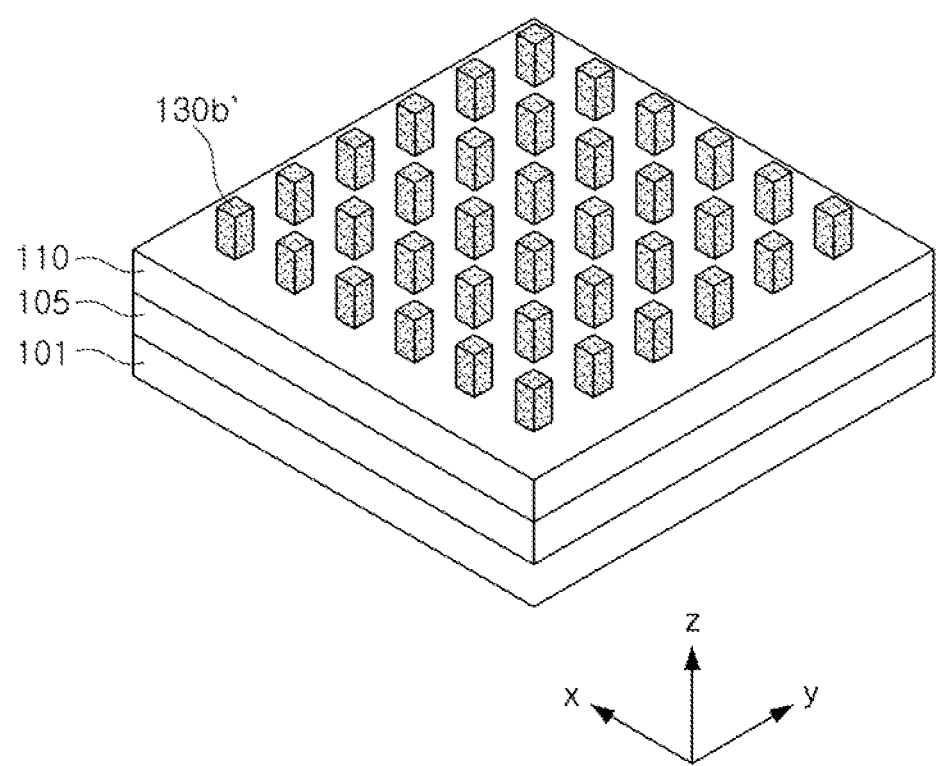
FIG. 19 is a perspective view illustrating a method of forming fine patterns in a semiconductor device according to certain example embodiments.

FIG. 19 is a perspective view illustrating a method of forming fine patterns in a semiconductor device according to an example embodiment of the inventive concepts.

Referring to FIG. 19, a plurality of sacrificial pillars 130b' may have flat upper surfaces in contrast to the sacrificial pillars 130b shown in FIG. 12. A method of forming the plurality of sacrificial pillars may include forming the first spacer patterns 130a on the first planarized layer 135 as shown in FIG. 5, and performing a planarization process to make upper surfaces of the spacer patterns 130 be flat.

The method described above in connection with FIGS. 1-19 may be described as a double-patterning method or a double patterning technology (DPT) process. Also, the method may be described as forming a plurality of spacer mask pillars, using the spacer mask pillars to form holes in a layer (e.g., an insulating layer), and forming contacts in the holes. As a result, a plurality of contacts of a semiconductor device such as a semiconductor chip may be formed using spacer mask pillars. In certain embodiments, the spacer mask pillars may have widths of about 16 nm to about 20 nm, thereby allowing for greater integration of the semiconductor device.

For example, as described above, in certain embodiments, a plurality of first spacer patterns (e.g., standalone spacer patterns such as 130a in FIG. 4) are formed on a substrate (e.g., 101) at a first height above the substrate, and extend in a first direction (e.g., the Y-direction). A plurality of second spacer patterns (e.g., standalone spacer patterns such as 160a in FIG. 8) are formed on the substrate (e.g., 101) at a second height above the substrate, and extend in a second direction (e.g., the X-direction). The second height is higher than the first height. Through the exemplary processes described above, the second spacer patterns are used to form spacer mask pillars from the first spacer patterns (as depicted, for example, in FIG. 12). Some of the spacer mask pillars may be removed (as depicted, for example, in FIG. 16), in order to later form holes in the insulating layer (as depicted, for example, in FIG. 18). The holes may then be filled with a conductive material, as described in certain examples above.

Figure 20:
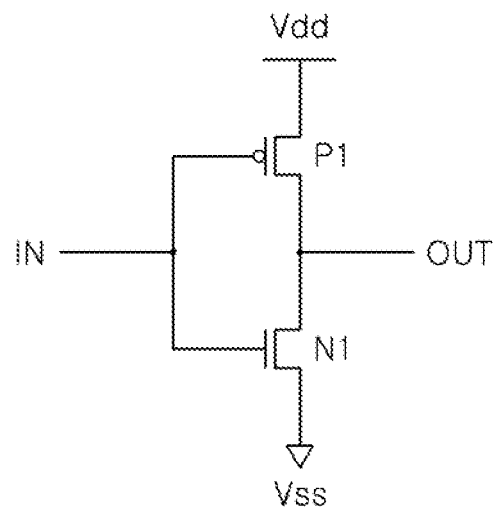
FIG. 20 is a circuit diagram illustrating a semiconductor device (an inverter) according to certain example embodiments.
Figure 21:
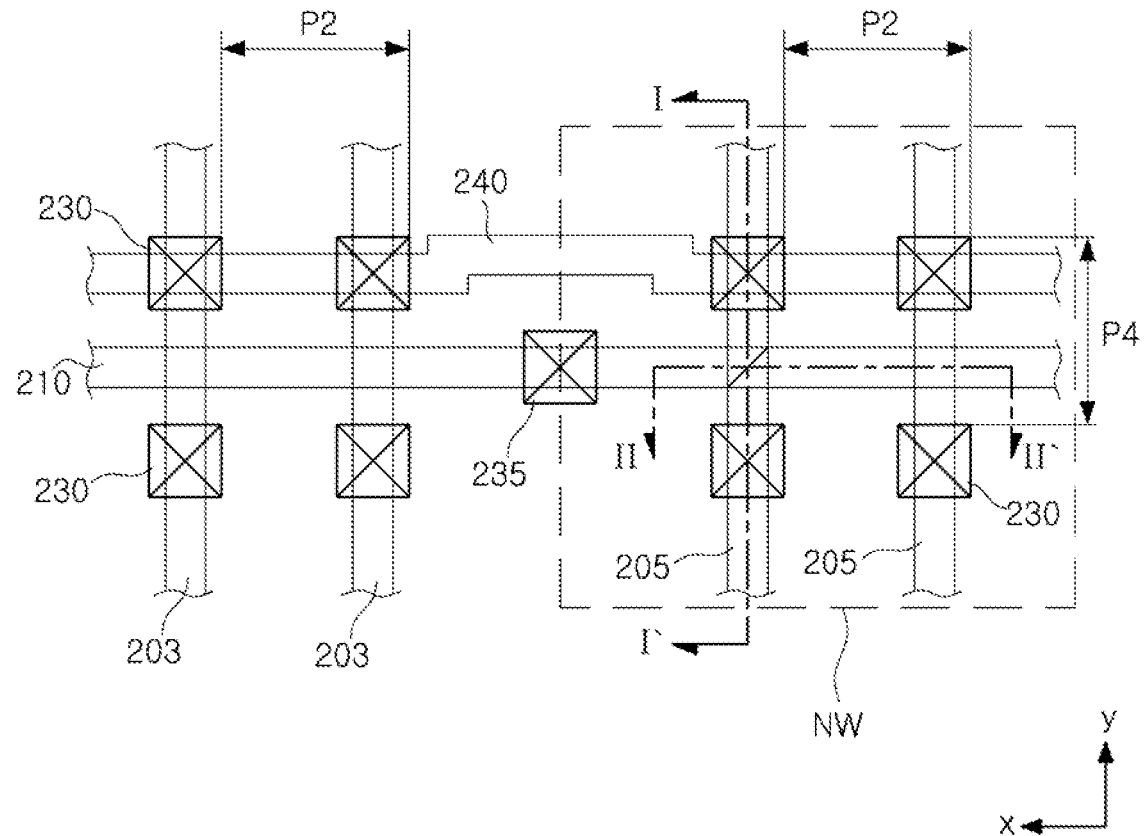
FIG. 21 is a layout illustrating a semiconductor device (an inverter) according to certain example embodiments.

FIG. 20 is a circuit diagram illustrating a semiconductor device (e.g., an inverter) according to an example embodiment of the inventive concepts. Specifically, the inverter may be a CMOS (Complementary Metal-Oxide-Semiconductor) inverter. FIG. 21 is a layout illustrating a semiconductor device (e.g., an inverter) according to an example embodiment of the inventive concepts.

As used herein, a semiconductor device may refer to any of the various devices such as shown in FIGS. 20-25, and may also refer, for example, to one or more transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

Referring to FIG. 20, the CMOS inverter may include a PMOS (P-type Metal Oxide-Semiconductor) field effect transistor P1 and a NMOS (N-type Metal-Oxide-Semiconductor) field effect transistor N1. The PMOS field effect transistor P1 and a NMOS field effect transistor N1 may be connected between a power supply node Vdd and a ground node Vss, and may be directly connected to each other. An input signal may be simultaneously input to the gate electrodes of the PMOS field effect transistor P1 and the NMOS field effect transistor N1. An output signal may be output from the drains of the PMOS field effect transistor and the NMOS field effect transistor. The inverter may invert the input signal to the output signal. For example, when the input signal is a logic level '1', the output signal may be a logic level '0'. The opposite situation may also be possible.

FIG. 21 illustrates one example of a semiconductor device that includes an inverter such as depicted in FIG. 20. Referring to FIG. 21, a semiconductor substrate may comprise a first region doped with n-type impurities and a second region doped with p-type impurities. The first region may be an N-well region. A plurality of first active fins 203 may be formed in the second region and a plurality of second active fins 205 may be formed in the first region. An NMOS field effect transistor may be formed on the first active fins 203 and a PMOS field effect transistor may be formed on the second active fins 205.

The first and second active fins 203 and 205 may be spaced apart from each other and extended in a first direction (e.g., Y-direction). A gate electrode 210 extending in a second direction (e.g., X-direction) may cross the first and second active fins 203 and 205.

A plurality of source/drain regions may be formed in the first and second active fins 203 and 205 at both sides of the gate electrode 210. A plurality of contacts 230 may be formed on the source/drain regions. The plurality of contacts 230 may be formed by using an example embodiment such as described above in connection with FIGS. 1 to 19. The plurality of contacts 230 may have a first pitch P4 in a first direction (e.g., Y-direction) and a second pitch P2 in a second direction (e.g., X-direction), and may have a first thickness in a first direction and a second thickness in a second direction. The pitches and thicknesses may have the same sizes as the ranges described previously in connection with FIGS. 1-19. For example, the holes 105h may be filled with a conductive material to form the contacts 230 that have substantially the same size as the holes 105h. Different known methods may be used once the holes 105h are formed to fill the holes with a conductive material, and different conductive materials may be used (e.g., a metal may be deposited to fill the holes and cover the lower layer, and may be planarized to form the holes exposed to the outside of the lower layer).

A wiring 240 may be formed to connect the drains of the PMOS field effect transistor and a NMOS field effect transistor each other.

Figure 22A:
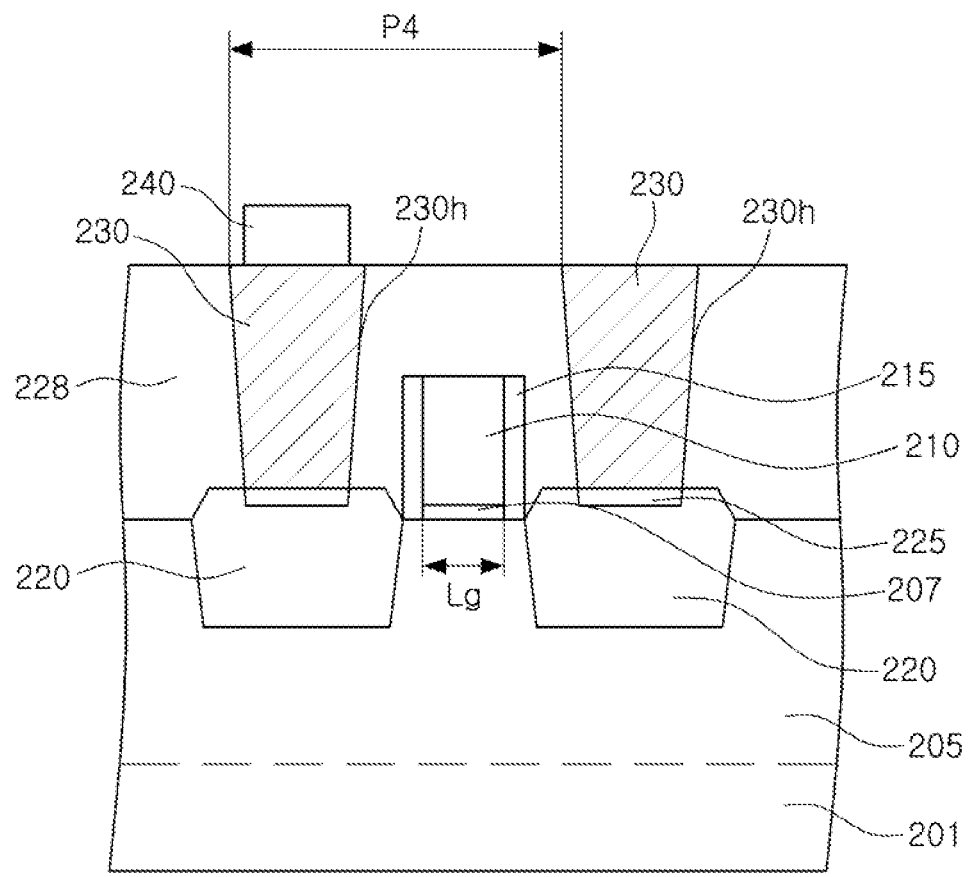
FIGS. 22a and 22b are cross-sectional views of a semiconductor device (an inverter) according to lines I-I' and II-II' of FIG. 21, respectively, according to certain example embodiments.
Figure 22B:
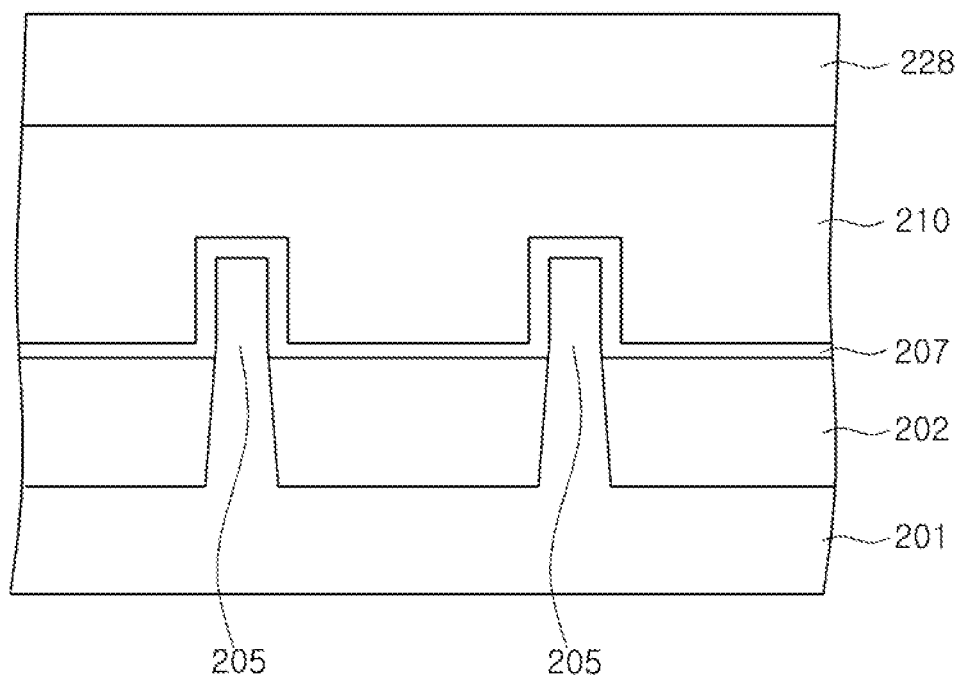

FIGS. 22a and 22b are cross-sectional views of a semiconductor device (an inverter) according to lines I-I' and II-II' of FIG. 21, respectively.

Referring to FIGS. 22a and 22b, a semiconductor device may comprise a substrate 210 including a plurality of active fins 205 defined by a device isolation region 202, a gate electrode 210 crossing the active fins 205, a gate dielectric layer 207 between the gate electrode 210 and the active fins 205, and a plurality of spacers 215 formed at both, opposite sides of the gate electrode 210. The gate dielectric layer 207 may be also formed between the gate electrode 210 and the device isolation region 202.

The gate dielectric layer 207 may comprise, for example, a silicon oxide layer, a silicon oxynitride layer, or a high-k material layer. The high-k material layer may include one or more of tantalum oxide, titanium oxide, hafnium oxide, zirconium oxide, aluminum oxide, yttrium oxide, niobium oxide, hafnium silicate, zirconium silicate, and/or a mixture thereof.

The semiconductor device may also include elevated source/drain regions 220 at both, opposite sides of the gate electrode 210, a plurality of contacts 230 having a pitch P4 formed on the elevated source/drain regions 220, and a wiring 240 formed on some of the plurality of contacts 230. In certain embodiments, the length of the gate electrode 210 may have a range of about 7 nm to about 10 nm. The size (e.g., a width) of the contacts 230 may have a range of about 16 nm to about 20 nm and the pitch P4 of each contact may have a range of about 44 nm to about 54 nm.

The elevated source/drain region 220 may comprise, for example, a silicon germanium epitaxial layer. The silicon germanium epitaxial layer may have a plurality of regions having different germanium concentrations.

The plurality of contacts 230 may be formed in an insulating layer 228 by using an example embodiment such as described above in connection with FIGS. 1-19. The plurality of contacts 230 may include a plurality of holes 230h exposing some portions of the elevated source/drain regions 220 and a conductive layer filling the plurality of holes 230h. The conductive layer may include, for example, a metal nitride layer and a metal layer. For example, the metal nitride layer may include one or more of titanium nitride (TiN), tantalum nitride (TaN), titanium aluminum nitride (TiAlN), and/or tungsten nitride (WN). The metal layer may include one or more of aluminum (Al), tungsten (W), and/or molybdenum (Mo). A metal silicide layer 225 may be further formed between the elevated source/drain regions 220 and the contacts 230.

For example, a semiconductor device such as an inverter may be formed by providing a substrate 201, a device isolation layer 202 on the substrate, active fins 205 extending from the substrate and separated by the device isolation layer 202, a gate dielectric layer 207 on the active fins 205, and a gate electrode 210 on the gate dielectric layer 207. Gate spacers 215 may be provided on side surfaces of the gate electrode 210, and source/drain regions 220 may be provided at opposite sides of the gate electrode 210. Then, an insulating layer 228 may be formed, and using one of the above exemplary methods, a plurality of holes 230h may be formed in the insulating layer 228. The holes 230h may be filled with a conductive material to form conductive contacts 230. The conductive material may include, for example, a metal. As a result of the holes 230h being filled, the metal silicide layer 225 may be formed between the elevated source/drain regions 220 and the contacts 230, for example where the metal reacts with silicon in the source/drain regions 220. After a process such as a chemical mechanical planarization (CMP) process, which may result in a top of the contacts 230 being coplanar with a top of the insulating layer 228, wiring 240 may be provided on certain of the contacts 230.

In certain embodiments, this process may create a plurality of integrated circuits on a semiconductor wafer. After such integrated circuits are formed, and additional processes are performed to protect the integrated circuits and form external conductive terminals connected to the integrated circuits, the wafer may be cut to form a plurality of semiconductor devices such as semiconductor chips. The chips may then be used to form semiconductor devices such as semiconductor packages including a package substrate, one or more semiconductor chips, and a molding material protecting the package. The semiconductor packages may be used to form an electronic device, such as a memory card, a memory module, a controller, or a microprocessor. Thus, a method of forming a semiconductor device or electronic device may include forming a semiconductor package, memory card, memory module, controller, or microprocessor, which includes holes formed in the manner described above in connection with FIGS. 1-19. As a result, a semiconductor device can be more highly integrated to allow, for example in the field of memory, a memory device (e.g., memory package, memory card, or memory module) having larger storage capacity in the same or smaller-sized devices.

Figure 23:
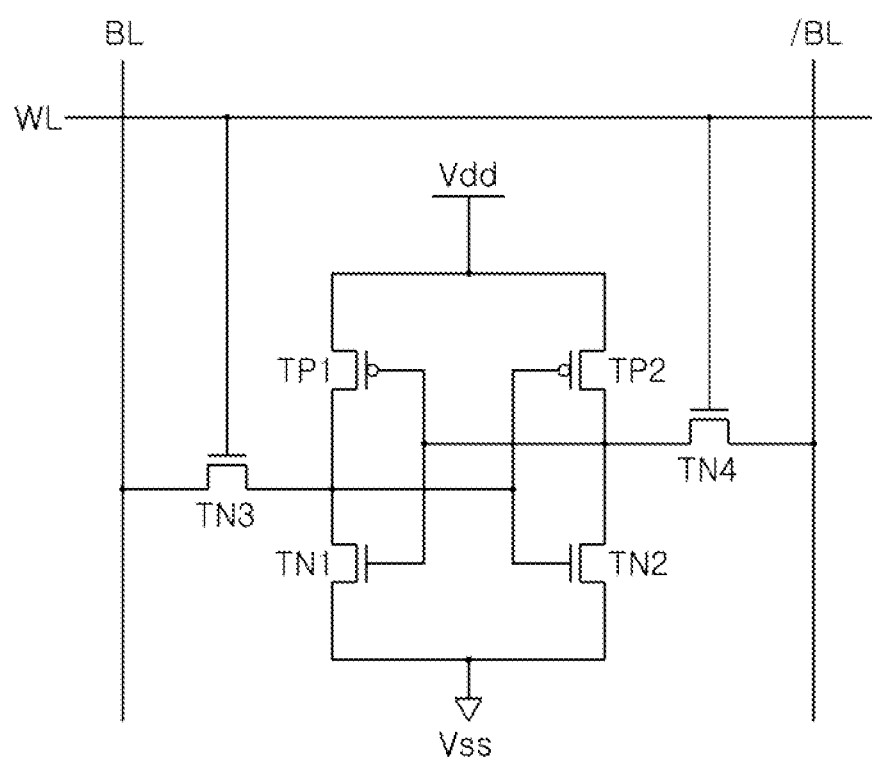
FIG. 23 is a circuit diagram illustrating a semiconductor device (an SRAM cell) according to certain example embodiments.
Figure 24:
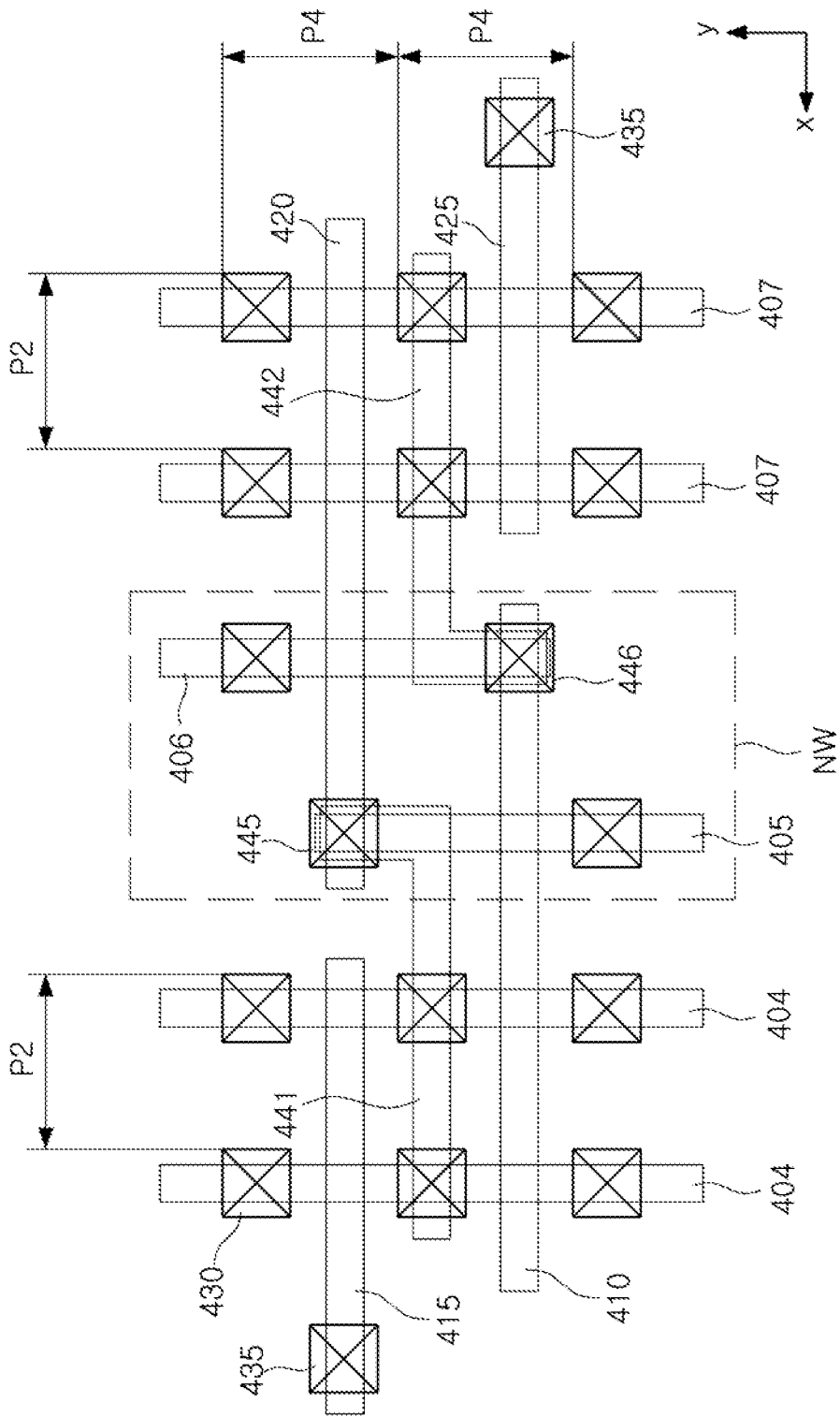
FIG. 24 is a layout diagram illustrating a semiconductor device (a SRAM cell) according to certain example embodiments.

FIGS. 23 and 24 are a circuit diagram and a layout illustrating a semiconductor device (e.g., an SRAM cell) according to an example embodiment of the inventive concepts, respectively. The SRAM cell may comprise six transistors. However, it shall not be restricted or limited thereto.

Referring to FIG. 23, the SRAM cell may have a first inverter and a second inverter, which are formed between a power supply node Vdd and a ground node Vss. The first inverter, having an input node and an output node, may comprise a first pull-up transistor TP1 and a first pull-down transistor TN1. The second inverter, having an input node and an output node, may have a second pull-up transistor TP2 and a second pull-down transistor TN2. The input node of the first inverter may be connected to a source/drain region of a second pass transistor TN4 as well as to the output node of the second inverter. The input node of the second inverter may be connected to a source/drain region of a first pass transistor TN4 as well as to the output node of the first inverter. Gate electrodes of the first and second pass transistors TN3 and TN4 may be connected to a word line WL. A bit line BL may be connected to a source/drain region of the first pass transistor TN3. A bit line bar/BL may be connected to a source/drain region of the second pass transistor TN4. The first and second pull-up transistors TP1 and TP2 may be PMOS transistors. The first and second pull-down transistors TN1 and TN2 and the first and second pass transistors TN3 and TN4 may be NMOS transistors.

FIG. 24 illustrates one example of a semiconductor device that includes an SRAM cell such as depicted in FIG. 23. Referring to FIG. 24, a semiconductor substrate may comprise a first region doped with an n-type impurities and a second region doped with p-type impurities. The first region may be an N-well region. A plurality of first active fins 404 and a plurality of fourth active fins 407 may be formed in the P-well region. A second active fin 405 and a third active fin 406 may be formed in the N-well region. A plurality of PMOS field effect transistors may be formed on the second and third active fins 405 and 406. A plurality of NMOS field effect transistors may be formed on the first and fourth active fins 404 and 407.

The first through fourth active fins 404 through 407 may be spaced apart from each other and extended in a first direction (e.g., Y-direction). The first through fourth active fins 404 through 407 may be in parallel to each other. Lengths of the second and third active fins 405 and 406 may be less than those of the first and fourth active fins 404 and 407. A first through fourth gate electrodes 410, 415, 420, and 425 may cross the first through fourth active fins 404 through 407. The first through fourth gate electrodes 410, 415, 420, and 425 may be extended in a second direction (e.g., X-direction).

A plurality of source/drain regions may be formed in the first through fourth active fins 404 through 407 at both sides of the first through fourth gate electrodes 410, 415, 420, and 425. A plurality of contacts 430 may be formed on the source/drain regions. The plurality of contacts 430 may be formed by using an example embodiment of the inventive concepts. The plurality of contacts 430 may have a first pitch P4 in a first direction (e.g., Y-direction) and a second pitch P2 in a second direction (e.g., X-direction). The plurality of contacts 430 may be formed by using an example embodiment such as described above in connection with FIGS. 1 to 19, and may have a first thickness in a first direction and a second thickness in a second direction. The pitches and thicknesses may have the same sizes as the ranges described previously in connection with FIGS. 1-19.

The second active fin 405 and the third gate electrode 420 may be connected to each other through a first shared contact 445 and a first wiring 441. The third active fin 406 and the first gate electrode 410 may be connected to each other through a second shared contact 446 and a second wiring 442. A plurality of contacts 435 may be formed on the second and fourth gate electrodes 415 and 425, respectively.

Figure 25:
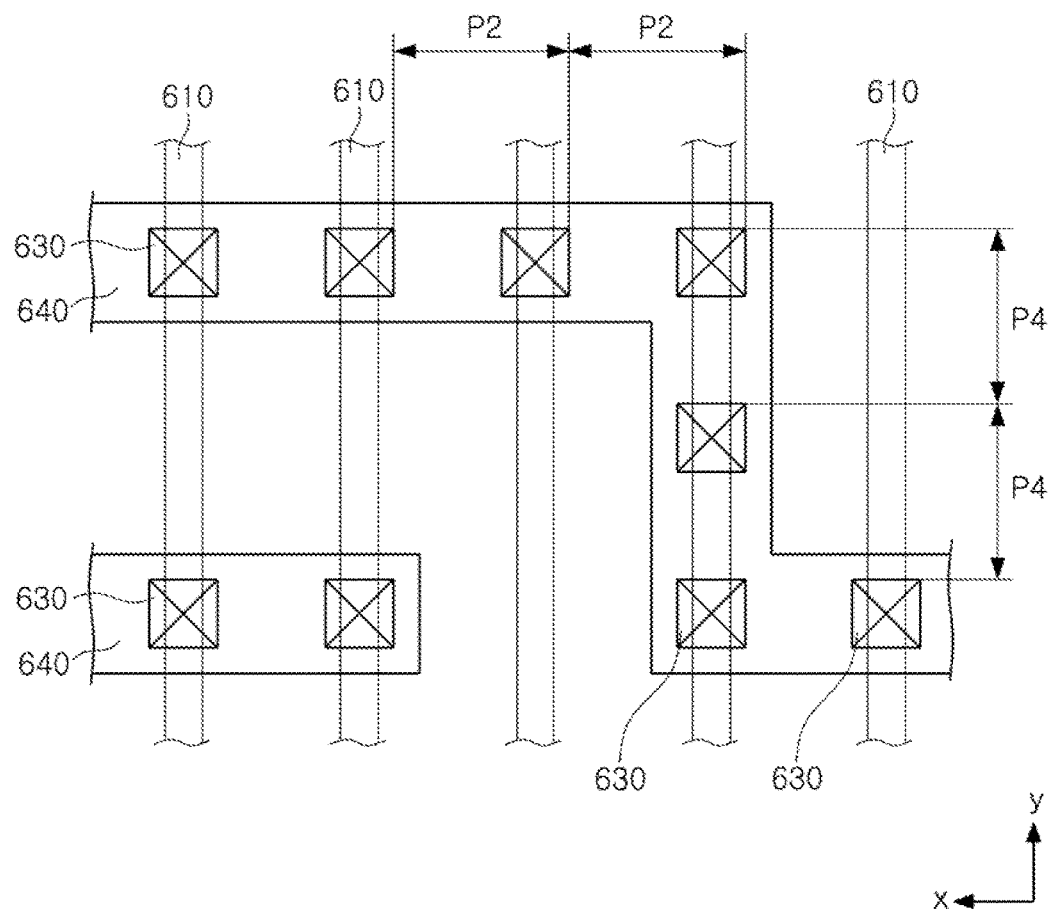
FIG. 25 is a layout diagram illustrating a metal wiring of a semiconductor device according to certain example embodiments.

FIG. 25 is a layout illustrating a metal wiring of a semiconductor device according to certain example embodiments.

Referring to FIG. 25, a lower metal wiring 610 may be extend in a first direction (e.g., Y-direction) and an upper metal wiring 640 crossing the lower metal wiring 610 may be extend in a second direction (e.g., X-direction). An interlayer dielectric layer having a low-k material may be formed between the lower metal wiring and the upper metal wiring. A plurality of via contacts 630 may be formed to connect the lower metal wiring 610 and the upper metal wiring 640 in the interlayer dielectric layer. The plurality of via contact 630 may be formed using one of the example embodiments described above on connection with FIGS. 1-19. The plurality of via contacts 630 may have a first pitch P4 in a first direction (e.g., Y-direction) and a second pitch P2 in a second direction (e.g., X-direction), and may have a first thickness in a first direction and a second thickness in a second direction. The pitches and thicknesses may have the same sizes as the ranges described previously in connection with FIGS. 1-19. A wiring structure and via contacts such as shown in FIG. 25 can be included in a semiconductor device such as a semiconductor chip, or a package substrate.

Figure 26:
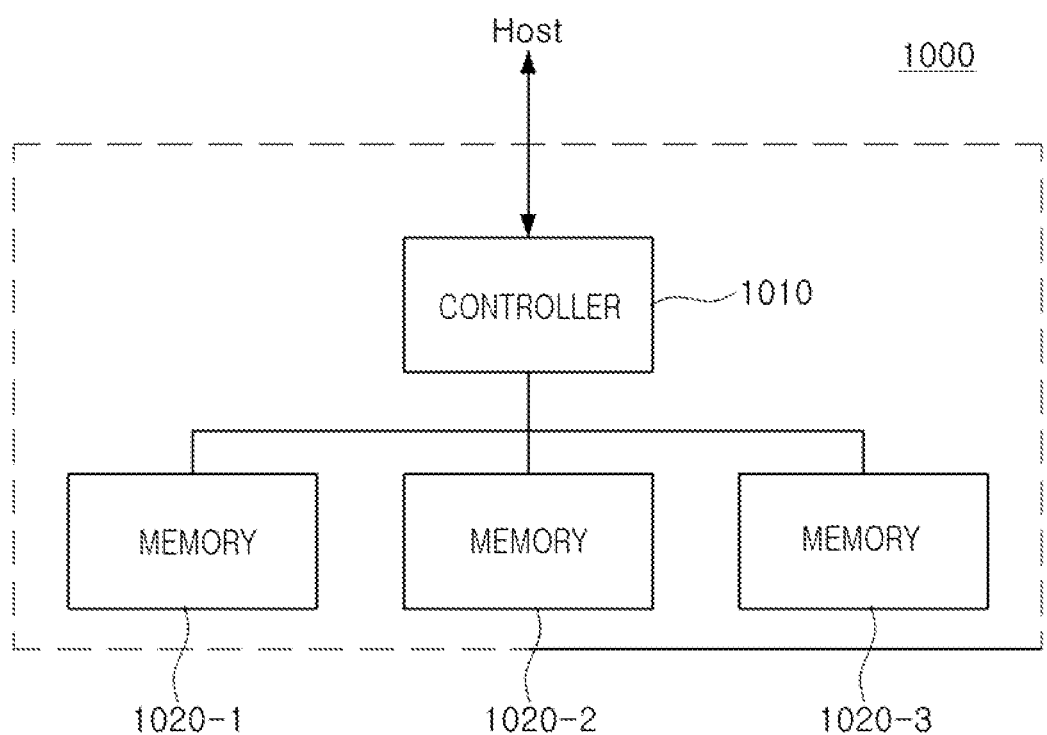
FIG. 26 is a block diagram of a storage device including a semiconductor device according to certain example embodiments.

FIG. 26 is a block diagram of a storage device including a semiconductor device according to an example embodiment.

Referring to FIG. 26, a storage apparatus 1000 according to the example embodiment of the present inventive concept may be an electronic device that includes a controller 1010 communicating with a Host, and memories 1020-1, 1020-2 and 1020-3 storing data. The respective memories 1020-1, 1020-2 and 1020-3 may be formed according to various embodiments of the present inventive concept described with reference to FIGS. 1 through 19.

Examples of the host communicating with the controller 1010 may include various electronic devices on which the storage apparatus 1000 is mounted. For example, the host may be, for example, a smartphone, a digital camera, a desktop computer, a laptop computer, a portable media player or the like. The controller 1010 may receive a data writing or reading request transferred from the host to store data in the memories 1020-1, 1020-2 and 1020-3 or generate a command for retrieving data from the memories 1020-1, 1020-2 and 1020-3.

As illustrated in FIG. 26, at least one or more memories 1020-1, 1020-2 and 1020-3 may be connected to the controller 1010 in parallel in the storage apparatus 1000. The plurality of memories 1020-1, 1020-2 and 1020-3 may be connected to the controller 1010 in parallel, whereby the storage apparatus 1000 having high capacity such as a solid state drive may be implemented. By using one or more of the methods described herein an electronic device such as storage apparatus 1000 or a host can be more highly integrated, and therefore can have, for example, a greater memory capacity while maintaining the same or a smaller size. For example, by using a manufacturing method such as described in connection with FIGS. 1-19, an electronic device such as a smart phone can be made to have a larger memory capacity, which can therefore include a greater amount of applications, and more storage for videos, music, pictures, and other media.

Figure 27:
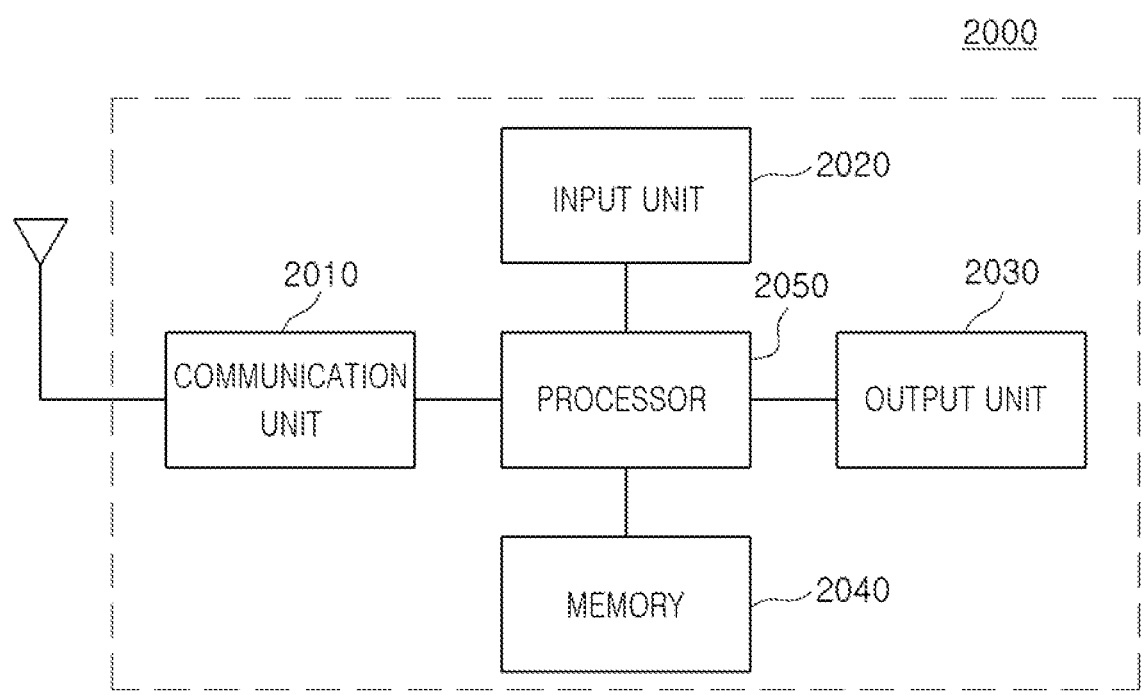
FIG. 27 is a block diagram of an electronic system including a semiconductor device according to certain example embodiments.

FIG. 27 is a block diagram of an electronic system including a semiconductor device according to an example embodiment of the inventive concepts.

Referring to FIG. 27, an electronic device such as an electronic apparatus 2000 according to the example embodiment may include a communications unit 2010, an input unit 2020, an output unit 2030, a memory 2040, and a processor 2050.

The communications unit 2010 may include a wired or wireless communications module, a wireless Internet module, a local area communications module, a global positioning system (GPS) module, a mobile communications module and the like. The wired or wireless communications module included in the communications unit 2010 may be connected to external communications networks according to various communications standard specification to transmit and receive data.

The input unit 2020 may be a module provided to control an operation of the electronic apparatus 2000 by a user and may include a mechanical switch, a touch screen, a voice recognition module, and the like. In addition, the input unit 2020 may include a mouse operating in a track ball or a laser pointer scheme or a finger mouse device. In addition to these, the input unit 2020 may further include various sensor modules allowing for a user to input data thereto.

The output unit 2030 may output information processed in the electronic apparatus 2000 in a sound or image form, and the memory 2040 may store programs for the processing and the control of the processor 2050. The memory 2040, and thus the electronic apparatus 2000 may be formed according to various example embodiments of the present inventive concept as described with reference to FIGS. 1 through 19. The processor 2050 may transfer a command to the memory 2040 according to a required operation to thereby store or retrieve data.

The memory 2040 may be embedded in the electronic apparatus 2000 to communicate with the processor 2050 or communicate with the processor 2050 through a separate interface. In a case in which the memory 2040 communicates with the processor 2050 through a separate interface, the processor 2050 may store or retrieve data, through various interface standards such as SD, SDHC, SDXC, MICRO SD, USB and the like.

The processor 2050 may control operations of respective components included in the electronic apparatus 2000. The processor 2050 may perform control and processing in association with voice communications, video telephony, data communications and the like, or may perform control and processing for multimedia reproduction and management. In addition, the processor 2050 may process an input transferred from a user through the input unit 2020 and may output results thereof through the output unit 2030. In addition, the processor 2050 may store data required in controlling the operation of the electronic apparatus 2000 as described above, in the memory 2040, or fetch data from the memory 2040.

Figure 28:
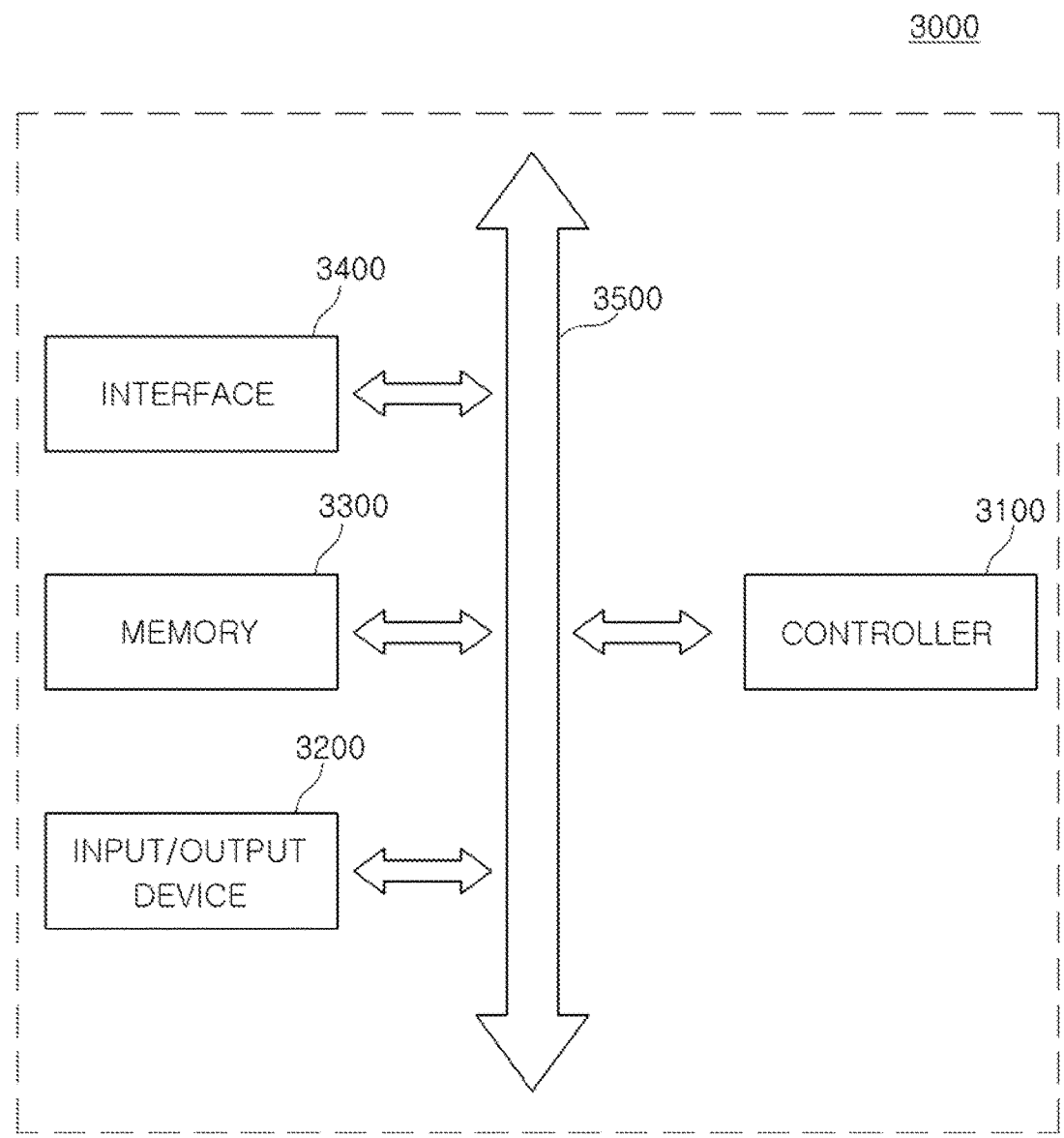
FIG. 28 is a block diagram of a system including a semiconductor device according to certain example embodiments.

FIG. 28 is a block diagram of a system including a semiconductor device according to an example embodiment of the inventive concepts.

Referring to FIG. 28, a system 3000 may include a controller 3100, an input/output device 3200, a memory 3300, and an interface 3400. The system 300 may be an electronic device such as a mobile system. Examples of the mobile system may include PDAs, portable computers, web tablets, wireless phones, mobile phones, digital music players and memory cards.

The controller 3100 may execute a program and control the system 300. The controller 3100 may be a microprocessor, a digital signal processor, a microcontroller or device similar thereto.

The input/output device 3200 may be used to input or output data to or from the system 3000. The system 3000 may be connected to an external device, for example, a personal computer or networks and may exchange data with the external device. The input/output device 3200 may be a keypad, a keyboard, or a display device.

The memory 3300 may store a code and/or data for operating the controller 3100 and/or store data having been processed by the controller 3100. The memory 3300 and/or controller 3100, and thus the system 300, may be formed according to one of the example embodiments described above in connection with FIGS. 1-19.

The interface 3400 may be a data transmission path between the system 3000 and an external device. The controller 3100, the input/output device 3200, the memory 3300, and the interface 3400 may be in communication with one another via a bus 3500.

As can be seen from the above discussion, a method of manufacturing an electronic device may include providing a semiconductor substrate and an insulating layer on the semiconductor substrate, forming a plurality of first spacer patterns extending in a first direction on the insulating layer, forming a first planarized layer on the first spacer patterns, forming a plurality of line mask patterns extending in a second direction on the first planarized layer, the second direction crossing the first direction, forming a plurality of sacrificial pillars by patterning the first spacer patterns using the line mask patterns as etch masks, forming a second planarized layer filling gaps between the sacrificial pillars, forming a plurality of openings in the second planarized layer by removing some of the sacrificial pillars, and forming a plurality of holes in the insulating layer by etching the insulating layer using the second planarized layer having the openings as an etch mask.

In some embodiments, the forming the plurality of openings may include forming a photoresist pattern on the second planarized layer, and removing some of the sacrificial pillars using the photoresist pattern as an etch mask.

In some embodiments, the forming the plurality of first spacer patterns may include forming a plurality of first sacrificial patterns extending in the first direction on the insulating layer, forming a plurality of first spacers on sidewalls of the first sacrificial patterns, and removing the first sacrificial patterns.

In some embodiments, the forming the first sacrificial patterns may include forming a first sacrificial layer on the insulating layer, forming a first photoresist pattern extending in the first direction on the first sacrificial layer, patterning the first sacrificial layer using the first photoresist pattern as an etch mask, and removing the first photoresist pattern.

In some embodiments, the forming the plurality of first spacers may include forming a spacer material layer conformally on the first sacrificial patterns, and performing an etch-back process on the spacer material layer.

In some embodiments, the forming the plurality of line mask patterns may include forming a hard mask layer on the first planarized layer, forming a plurality of second spacer patterns extending in the second direction on the hard mask layer, and patterning the hard mask layer using the second spacer patterns as etch masks.

In some embodiments, the forming the plurality of second spacer patterns may include forming a plurality of second sacrificial patterns extending in the second direction on the second hard mask layer, forming a plurality of second spacers on sidewalls of the second sacrificial patterns, and removing the second sacrificial patterns.

In some embodiments, the forming the plurality of second sacrificial patterns may include forming a second sacrificial layer on the second hard mask layer, forming a second photoresist pattern extending in the second direction on the second sacrificial layer, patterning the second sacrificial layer using the second photoresist pattern as an etch mask, and removing the second photoresist pattern.

In some embodiments, the forming the plurality of second spacers may include forming a spacer material layer conformally on the second sacrificial patterns, and performing an etch-back process on the spacer material layer.

In some embodiments, the forming the plurality of sacrificial pillars may include performing an anisotropic etching for the first planarized layer and the first spacer patterns, and removing the line mask patterns and the first planarized layer.

In some embodiments, the second direction may be substantially perpendicular to the first direction.

In some embodiments, widths of the first spacer patterns and the second spacer patterns may be substantially the same as each other.

In some embodiments, pitches of the first spacer patterns and the second spacer patterns may be substantially the same as each other.

In some embodiments, conductive contacts are formed in the holes, and one or more conductive lines are provided on the substrate, each line connected to one or more of the conductive contacts.

In certain example embodiments, a method of manufacturing a semiconductor device may include forming a first hard mask layer on an insulating layer, forming a plurality of sacrificial pillars on the first hard mask layer, the plurality of sacrificial pillars being spaced apart from each other in a first and a second direction, and the first direction being substantially perpendicular to the second direction, forming a planarized layer filling gaps between the sacrificial pillars, forming a plurality of openings in the planarized layer by removing some of the sacrificial pillars so as to expose some portions of the first hard mask layer, forming a hard mask pattern by patterning the first hard mask layer using the planarized layer having the openings as an etch mask, and forming a plurality of holes in the insulating layer by etching the insulating layer using the hard mask pattern as an etch mask.

In some embodiments, the forming the plurality of sacrificial pillars may include forming a plurality of first spacer patterns extending in the first direction on the first hard mask layer, forming a plurality of line mask patterns extending in the second direction on the first spacer patterns, and patterning the first spacer patterns using the line mask patterns as etch masks.

In some embodiments, the forming the plurality of line mask patterns may include forming a second hard mask layer on the first spacer patterns forming a plurality of second spacer patterns extending in the second direction on the second hard mask layer, and patterning the second hard mask layer using the second spacer patterns as etch masks.

In some embodiments, widths of the first spacer patterns and the second spacer patterns may be substantially the same as each other.

In some embodiments, pitches of the first spacer patterns and the line mask patterns may be substantially the same as each other.

As discussed above, and in particular detail, in some embodiments, a method of forming fine patterns in a semiconductor device may include forming a first hard mask layer on an insulating layer, forming a plurality of first sacrificial patterns extending in parallel in a first direction on the first hard mask layer, each of the first sacrificial patterns having a first pitch, forming a plurality of first spacers on sidewalls of the first sacrificial patterns, forming a plurality of first spacer patterns extending in parallel in the first direction by removing the first sacrificial patterns, each of the first spacer patterns having a second pitch, forming a first planarized layer on the first spacer patterns, forming a second hard mask layer on the first planarized layer, forming a plurality of second sacrificial patterns extending in parallel in the second direction on the second hard mask layer, each of the second sacrificial patterns having a third pitch, forming a plurality of second spacers on sidewalls of the second sacrificial patterns, forming a plurality of second spacer patterns extending in parallel in the second direction by removing the second sacrificial patterns, each of the second spacer patterns having a fourth pitch, forming a plurality of line mask patterns by patterning the second hard mask layer using the second spacer patterns as etch masks, forming a plurality of sacrificial pillars by patterning the first spacer patterns using the line mask patterns as etch masks, forming a second planarized layer filling gaps between the sacrificial pillars, forming a photoresist pattern on the second planarized layer, the photoresist pattern exposing some portions of the second planarized layer, forming a plurality of openings in the second planarized layer by removing some of the sacrificial pillars using the photoresist pattern as an etch mask, forming a hard mask pattern by patterning the first hard mask layer using the second planarized layer having the openings as an etch mask, and forming a plurality of holes in the insulating layer by etching the insulating layer using the hard mask pattern as an etch mask.

In some embodiments, the second direction may be substantially perpendicular to the first direction. In some embodiments, the first pitch may be substantially twice the second pitch. In some embodiments, the third pitch may be substantially twice the fourth pitch. In some embodiments, the first pitch may be substantially the same as the third pitch. In some embodiments, the second pitch may be substantially the same as the fourth pitch. In some embodiments, widths of the first spacer patterns and the second spacer patterns may be substantially the same as each other.

Further, as discussed in connection with the various examples above, a method of manufacturing an electronic device includes providing a semiconductor substrate, providing an insulating layer on the semiconductor substrate, forming a plurality of first spacer patterns on the substrate, the plurality of first spacer patterns extending in a first direction, forming a plurality of second spacer patterns on the substrate, the plurality of second spacer patterns extending in a second direction and crossing the plurality of first spacer patterns, using the second spacer patterns to form spacer mask pillars from the first spacer patterns, removing some of the spacer mask pillars to form holes in the insulating layer, and filling the holes with a conductive material.

The second spacer patterns may be at a vertical height above the first spacer patterns. The conductive material in the holes may form conductive contacts connected to one or more conductive lines. In addition, a plurality of transistors may be connected to the conductive contacts. The transistors may be part of a semiconductor chip. An electronic device may be formed that includes the semiconductor chip.

In some embodiments, forming the plurality of first spacer patterns includes forming a first hard mask layer on the insulating layer, forming a first sacrificial pattern on the first hard mask layer, and forming the first spacer patterns on sidewalls of the sacrificial pattern. In addition, forming the plurality of second spacer patterns may include forming a first planarization layer on the plurality of first spacer patterns, forming a second sacrificial pattern on the first planarization layer, and forming the second spacer patterns on sidewalls of the sacrificial pattern.

The above-disclosed subject matter is to be considered illustrative and not restrictive, and the appended claims are intended to cover all such modifications, enhancements, and other embodiments, which fall within the true spirit and scope of the disclosed embodiments. Thus, the scope of the invention is to be determined by the broadest permissible interpretation of the following claims and their equivalents, and shall not be restricted or limited by the foregoing detailed description.

What is claimed is:

1. A method of manufacturing an electronic device, the method comprising:
   providing a semiconductor substrate and an insulating layer on the semiconductor substrate;
   forming a plurality of first spacer patterns extending in a first direction on the insulating layer;
   forming a first planarized layer on the first spacer patterns;
   forming a plurality of line mask patterns extending in a second direction on the first planarized layer, the second direction crossing the first direction;
   forming a plurality of sacrificial pillars by patterning the first spacer patterns using the line mask patterns as etch masks;
   forming a second planarized layer filling gaps between the sacrificial pillars;
   forming a plurality of openings in the second planarized layer by removing some of the sacrificial pillars; and
   forming a plurality of holes in the insulating layer by etching the insulating layer using the second planarized layer having the openings as an etch mask.

2. The method of claim 1, wherein the forming the plurality of openings comprises:
   forming a photoresist pattern on the second planarized layer; and
   removing some of the sacrificial pillars using the photoresist pattern as an etch mask.

3. The method of claim 1, wherein the forming the plurality of first spacer patterns comprises:
   forming a plurality of first sacrificial patterns extending in the first direction on the insulating layer;
   forming a plurality of first spacers on sidewalls of the first sacrificial patterns; and
   removing the first sacrificial patterns.

4. The method of claim 3, wherein the forming the first sacrificial patterns comprises:
   forming a first sacrificial layer on the insulating layer;
   forming a first photoresist pattern extending in the first direction on the first sacrificial layer;
   patterning the first sacrificial layer using the first photoresist pattern as an etch mask; and
   removing the first photoresist pattern.

5. The method of claim 3, wherein the forming the plurality of first spacers comprises:
   forming a spacer material layer conformally on the first sacrificial patterns; and
   performing an etch-back process on the spacer material layer.

6. The method of claim 1, wherein the forming the plurality of line mask patterns comprises:
   forming a hard mask layer on the first planarized layer;
   forming a plurality of second spacer patterns extending in the second direction on the hard mask layer; and
   patterning the hard mask layer using the second spacer patterns as etch masks.

7. The method of claim 6, wherein the forming the plurality of second spacer patterns comprises:
   forming a plurality of sacrificial patterns extending in the second direction on the hard mask layer;
   forming a plurality of spacers on sidewalls of the sacrificial patterns; and
   removing the sacrificial patterns.

8. The method of claim 7, wherein the forming the plurality of sacrificial patterns comprises:
   forming a sacrificial layer on the hard mask layer;
   forming a photoresist pattern extending in the second direction on the sacrificial layer;
   patterning the sacrificial layer using the photoresist pattern as an etch mask; and
   removing the photoresist pattern.

9. The method of claim 7, wherein the forming the plurality of spacers comprises:
   forming a spacer material layer conformally on the sacrificial patterns; and
   performing an etch-back process on the spacer material layer.

10. The method of claim 1, wherein the forming the plurality of sacrificial pillars comprises:
    performing an anisotropic etching for the first planarized layer and the first spacer patterns; and
    removing the line mask patterns and the first planarized layer.

11. The method of claim 1, wherein the second direction is substantially perpendicular to the first direction.

12. The method of claim 6, wherein widths of the first spacer patterns and the second spacer patterns are substantially the same as each other.

13. The method of claim 6, wherein pitches of the first spacer patterns and the second spacer patterns are substantially the same as each other.

14. The method of claim 1, further comprising:
    forming conductive contacts in the holes; and
    providing one or more conductive lines on the substrate, each line connected to one or more of the conductive contacts.

15. A method of manufacturing a semiconductor device, the method comprising:
    forming a first hard mask layer on an insulating layer;
    forming a plurality of sacrificial pillars on the first hard mask layer, the plurality of sacrificial pillars being spaced apart from each other in a first and a second direction, and the first direction being substantially perpendicular to the second direction;
    forming a planarized layer filling gaps between the sacrificial pillars;
    forming a plurality of openings in the planarized layer by removing some of the sacrificial pillars so as to expose some portions of the first hard mask layer;
    forming a hard mask pattern by patterning the first hard mask layer using the planarized layer having the openings as an etch mask;
    forming a plurality of holes in the insulating layer by etching the insulating layer using the hard mask pattern as an etch mask.

16. The method of claim 15, wherein the forming the plurality of sacrificial pillars comprises:
    forming a plurality of first spacer patterns extending in the first direction on the first hard mask layer;
    forming a plurality of line mask patterns extending in the second direction on the first spacer patterns; and
    patterning the first spacer patterns using the line mask patterns as etch masks.

17. A method of manufacturing an electronic device, the method comprising:
    providing a semiconductor substrate;
    providing an insulating layer on the semiconductor substrate;
    forming a plurality of first spacer patterns on the substrate, the plurality of first spacer patterns extending in a first direction;
    forming a plurality of second spacer patterns on the substrate, the plurality of second spacer patterns extending in a second direction and crossing the plurality of first spacer patterns;
    using the second spacer patterns to form spacer mask pillars from the first spacer patterns;
    removing some of the spacer mask pillars to form holes in the insulating layer; and
    filling the holes with a conductive material.

18. The method of claim 17, wherein the second spacer patterns are at a vertical height above the first spacer patterns.

19. The method of claim 18, wherein the conductive material in the holes comprise conductive contacts connected to one or more conductive lines, and further comprising:
    providing a plurality of transistors connected to the conductive contacts, the transistors being part of a semiconductor chip; and
    forming an electronic device that includes the semiconductor chip.

20. The method of claim 18, further comprising:
    forming the plurality of first spacer patterns by:
       forming a first hard mask layer on the insulating layer, forming a first sacrificial pattern on the first hard mask layer, and forming the first spacer patterns on sidewalls of the first sacrificial pattern; and forming the plurality of second spacer patterns by:

forming a first planarization layer on the plurality of first spacer patterns, forming a second sacrificial pattern on the first planarization layer, and forming the second spacer patterns on sidewalls of the second sacrificial pattern.

\* \* \* \* \*